United States Patent
Ide

(10) Patent No.: US 9,136,204 B2
(45) Date of Patent: Sep. 15, 2015

(54) SEMICONDUCTOR DEVICE HAVING PENETRATING ELECTRODES EACH PENETRATING THROUGH SUBSTRATE

(71) Applicant: PS4 Luxco S.a.r.l., Luxembourg (LU)

(72) Inventor: Akira Ide, Tokyo (JP)

(73) Assignee: PS4 Luxco S.a.r.l., Luxembourg (LU)

(*) Notice: Subject to any disclaimer, the term of this patent is extended or adjusted under 35 U.S.C. 154(b) by 0 days.

(21) Appl. No.: 13/780,979

(22) Filed: Feb. 28, 2013

(65) Prior Publication Data
US 2013/0228898 A1  Sep. 5, 2013

(30) Foreign Application Priority Data
Mar. 5, 2012  (JP) ................ 2012-047803

(51) Int. Cl.
*H01L 29/40*  (2006.01)
*H01L 23/48*  (2006.01)
(Continued)

(52) U.S. Cl.
CPC .......... *H01L 23/481* (2013.01); *H01L 23/3128* (2013.01); *H01L 23/3135* (2013.01); *H01L 23/562* (2013.01); *H01L 23/585* (2013.01); *H01L 25/0657* (2013.01); *H01L 25/18* (2013.01); *H01L 21/563* (2013.01); *H01L 23/49816* (2013.01); *H01L 2224/16145* (2013.01); *H01L 2224/16225* (2013.01); *H01L 2225/06513* (2013.01); *H01L 2225/06517* (2013.01); *H01L 2225/06544* (2013.01); *H01L 2924/15311* (2013.01)

(58) Field of Classification Search
CPC .. H01L 21/76898; H01L 23/48; H01L 23/481
USPC ................ 257/621, 737, 773, 774, 777, 778, 257/E23.011, E23.067, E25.013
See application file for complete search history.

(56) References Cited

U.S. PATENT DOCUMENTS

| 7,115,972 B2 * | 10/2006 | Dotta et al. .............. 257/621 |
| 7,944,058 B2 | 5/2011 | Ishihara |
| 8,269,350 B1 * | 9/2012 | Chen et al. .............. 257/774 |

(Continued)

FOREIGN PATENT DOCUMENTS

| JP | 2005-136187 A | 5/2005 |
| JP | 2006-049417 A | 2/2006 |

*Primary Examiner* — Meiya Li
*Assistant Examiner* — Peter M Albrecht

(57) ABSTRACT

Disclosed herein is a device including a first semiconductor chip having a first internal circuit formed in a first substrate, and a plurality of penetrating electrodes each penetrating through the first semiconductor substrate. The plurality of penetrating electrodes includes first, second, third and fourth penetrating electrodes arranged along a first line. The first and second penetrating electrodes are in a floating state without being electrically connected to the first internal circuit. The third penetrating electrode is electrically connected to a first power supply line that conveys a first power supply potential to the first internal circuit. The fourth penetrating electrode is electrically connected to a second power supply line that conveys a second power supply potential to the first internal circuit. The third and fourth penetrating electrodes are arranged between the first penetrating electrode and the second penetrating electrode.

8 Claims, 18 Drawing Sheets

(51) Int. Cl.
*H01L 23/31* (2006.01)
*H01L 23/00* (2006.01)
*H01L 23/58* (2006.01)
*H01L 25/065* (2006.01)
*H01L 25/18* (2006.01)
*H01L 23/498* (2006.01)
*H01L 21/56* (2006.01)

(56) References Cited

U.S. PATENT DOCUMENTS

| | | | |
|---|---|---|---|
| 2010/0052111 A1* | 3/2010 | Urakawa | 257/621 |
| 2010/0171226 A1* | 7/2010 | West et al. | 257/774 |
| 2011/0140126 A1* | 6/2011 | Gaul et al. | 257/77 |
| 2011/0201178 A1 | 8/2011 | Ishihara | |
| 2013/0049220 A1* | 2/2013 | Hsieh et al. | 257/774 |

* cited by examiner

SEMICONDUCTOR DEVICE HAVING PENETRATING ELECTRODES EACH PENETRATING THROUGH SUBSTRATE

This application claims priority to Japanese patent application no. 2010-047803,filed Mar. 5,2010,the intire contents of which is incorporated herein by reference.

BACKGROUND OF THE INVENTION

1. Field of the Invention

The present invention relates to a semiconductor device, and particularly to a semiconductor device equipped with a penetrating electrode which is so provided as to pass through a substrate.

2. Description of Related Art

Storage capacity required for semiconductor memory devices such as DRAM (Dynamic Random Access Memory) has been growing year by year. To satisfy the requirement, in recent years, a memory device called multi-chip package has been proposed. In the multi-chip package, a plurality of memory chips are stacked. However, in the case of the multi-chip package, a wire needs to be provided for each chip to connect each memory chip and a package substrate. Therefore, it is difficult to stack many memory chips.

On the other hand, in recent years, a semiconductor device of a type in which a plurality of memory chips with penetrating electrodes are stacked has been proposed (See Japanese Patent Application Laid-Open No. 2005-136187). In the semiconductor device of the type, among penetrating electrodes provided on each memory chip, the penetrating electrodes that are provided on the same plane position when seen from a stacking direction are electrically short-circuited. Therefore, even if the number of chips stacked increases, the number of electrodes connected to the package substrate does not increase. Thus, it is possible to stack a larger number of memory chips.

When semiconductor chips with penetrating electrodes are stacked, bump electrodes that are provided on upper and lower chips need to be in accurate contact with each other. Accordingly, compared with an operation of stacking chips in the multi-chip package, more accurate positioning is required. As for a device used to stack semiconductor chips having penetrating electrodes, the device disclosed in Japanese Patent Application Laid-Open No. 2006-49417 is known.

However, when the semiconductor chips are stacked, even as accurate positioning is carried out, the bonding strength between the semiconductor chips could be uneven if the semiconductor chips are warped. In such a case, there is the possibility that the bump electrodes, which should be originally bonded together, come off from each other, possibly lowering the reliability of products.

SUMMARY

In one embodiment, there is provided a semiconductor device that includes a first semiconductor chip including a first internal circuit formed in a first semiconductor substrate, and a plurality of penetrating electrodes each penetrating through the first semiconductor substrate. The plurality of penetrating electrodes includes first, second, third and fourth penetrating electrodes arranged along a first line. The first and second penetrating electrodes are in a floating state without electrically being connected to the first internal circuit. The third penetrating electrode is electrically connected to a first power supply line that conveys a first power supply potential to the first internal circuit. The fourth penetrating electrode is electrically connected to a second power supply line that conveys a second power supply potential to the first internal circuit. The third and fourth penetrating electrodes are arranged between the first penetrating electrode and the second penetrating electrode.

In another embodiment, there is provided semiconductor device that includes a semiconductor chip including an internal circuit and a semiconductor substrate, and a plurality of penetrating electrodes each penetrating through the semiconductor substrate. The plurality of penetrating electrodes include a first penetrating electrode group arranged along a first line. The first penetrating electrode group includes a first penetrating electrode arranged closest to a first side of the semiconductor chip among the first penetrating electrode group. The first penetrating electrode is in a floating state without being electrically connected to the internal circuit.

In still another embodiment, there is provided a semiconductor device that includes: an interposer having a first surface on which a plurality of substrate electrodes are provided; a first semiconductor chip mounted on the first surface of the interposer, the first semiconductor chip includes a first penetrating electrode group including a plurality of penetrating electrodes each penetrating through a first semiconductor substrate and arranged along a first line; and a second semiconductor chip mounted over the first semiconductor chip, the second semiconductor chip includes a second penetrating electrode group having a plurality of penetrating electrodes each penetrating through a second semiconductor substrate. The first penetrating electrode group includes a first penetrating electrode arranged closest to a first side of the first semiconductor chip, and a second penetrating electrode arranged far from the first side compared with the first penetrating electrode. The second penetrating electrode group includes third and fourth penetrating electrodes vertically aligned with the first and second penetrating electrodes, respectively. The first semiconductor chip includes a second surface that faces the first surface of the interposer, a third surface positioned opposite to the second surface, first and second bump electrodes provided on the second surface and vertically aligned with the first and second penetrating electrodes, respectively, and third and fourth bump electrodes provided on the third surface and vertically aligned with the first and second penetrating electrodes, respectively. The second semiconductor chip includes a fourth surface that faces the third surface of the first semiconductor chip, a fifth surface positioned opposite to the fourth surface, fifth and sixth bump electrodes provided on the fourth surface and vertically aligned with the third and fourth penetrating electrodes, respectively, and seventh and eighth bump electrodes provided on the fifth surface and vertically aligned with the third and fourth penetrating electrodes, respectively. The third bump electrode and the fifth bump electrode are bonded to each other, and the fourth bump electrode and the sixth bump electrode are bonded to each other. The plurality of substrate electrodes include a first substrate electrode vertically aligned with and bonded to the second bump electrode, whereas the plurality of substrate electrodes include no substrate electrode vertically aligned with and bonded to the first bump electrode.

According to the present embodiment, bonding strength between stacked semiconductor chips can be increased. Therefore, it is possible to increase reliability of a stacked semiconductor device.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
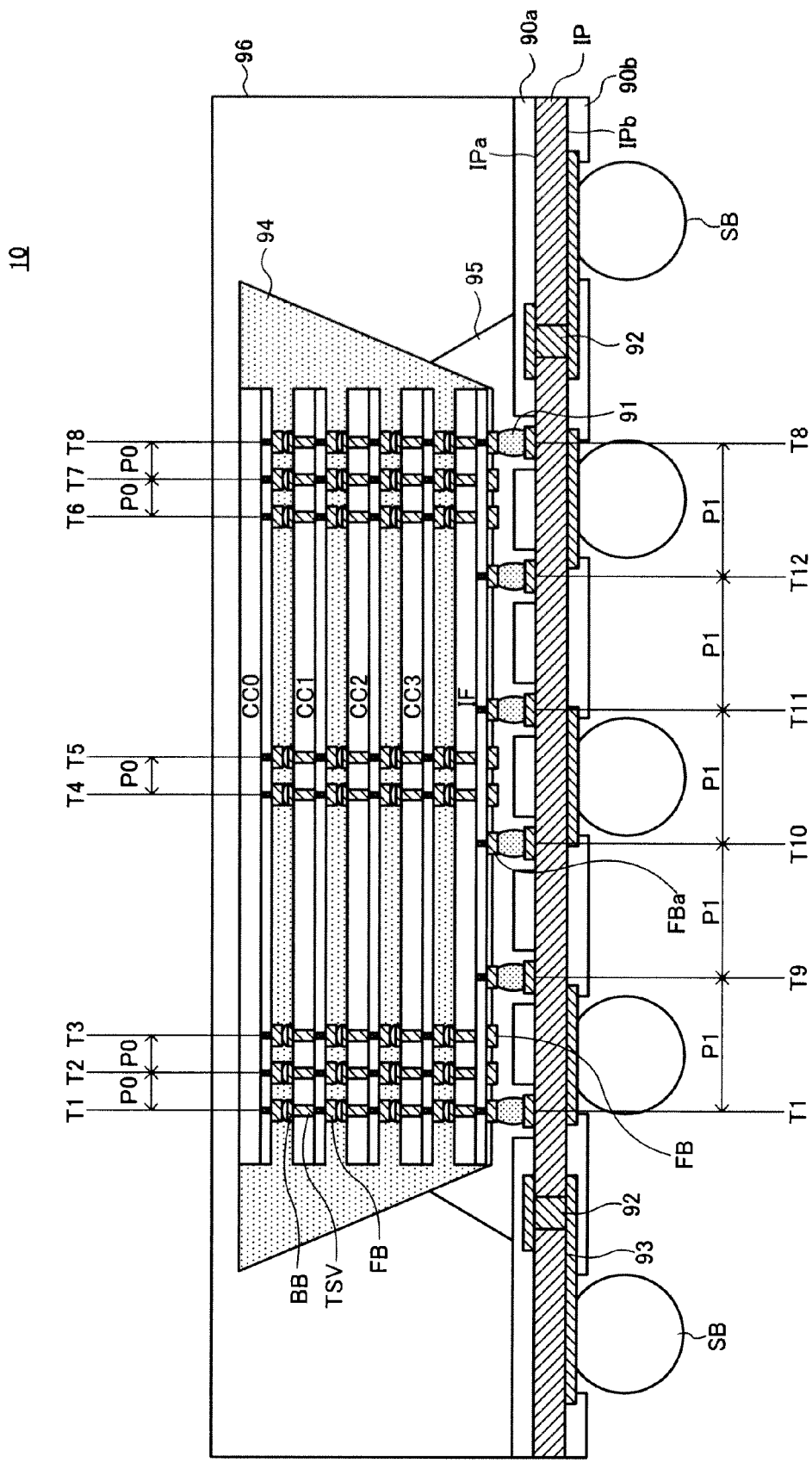
FIG. 1 is a schematic cross-sectional view of a semiconductor device an embodiment of the present invention.

Referring now to FIG. 1, the semiconductor device 10 of the embodiment has a structure in which the following components are stacked: four core chips CC0 to CC3, which have the some functions and are produced with the use of the same production mask; one interface chip IF, which is produced with the use of a different production mask from that of the core chips CC0 to CC3; and one interposer IP. The core chips CC0 to CC3 and the interface chip IF are semiconductor chips for which a silicon substrate is used, and are stacked by a face-clown method on the interposer IP. The face-down method means a method of mounting semiconductor chips in such a way that principal surfaces on which electronic circuits such as transistors are formed face downward, or that the principal surfaces face the interposer IP's side.

However, the semiconductor device of the present invention is not limited to the above structure. The semiconductor chips each may be stacked by a face-up method. The face-up method means a method of mounting semiconductor chips in such a way that principal surfaces on which electronic circuits such as transistors are formed face upward, or that the principal surfaces face a side opposite to the interposer IP's side. Alternatively, the semiconductor chips stacked by the face-down method, and the semiconductor chips stacked by the face-up method may exist together.

Among the semiconductor chips, the core chips CCI to CC3 and the interface chip IF other than the core chip CC0 placed on the top layer are provided with large numbers of penetrating electrodes (through-substrate vias) TSV that pass through a substrate. Also, TSV may be called penetration electrodes, penetration vias, through electrode, or through-vias. In areas that overlap with the penetrating electrodes TSV when seen from a stacking direction in planar view, top-surface bumps FB are provided on the principal-surface sides of the chips, and back-surface bumps BB are provided on the back-surface sides of the chips. The back-surface bumps BB of a semiconductor chip, which is placed on a lower layer, are bonded to the top-surface bumps FB of a semiconductor chip which is placed on an upper layer. In this manner, the semiconductor chips that are adjacent to each other in the vertical direction are electrically connected.

According to the present embodiment, the reason why no penetrating electrode TSV is provided on the top-layer core chip CC0 is because there is no need to form a bump electrode on the back-surface side of the core chip CC0 as the chips are stacked by the face-down method. If no penetrating electrode TSV is provided on the top-layer core chip CC0 as described above, the top-layer core chip CC0 can be made thicker than the other core chips CC1 to CC3 to increase the mechanical strength of the core chip CC0. However, according to the present invention, a penetrating electrode TSV may be provided on the top-layer core chip CC0. In this case, all core chips CC0 to CC3 can be produced by the same process.

The core chips CC0 to CC3 are semiconductor chips made by removing the so-called front-end section, which serves as an interface with the outside, from circuit blocks contained in atypical SDRAM (Synchronous Dynamic Random Access Memory) that operates alone. In other words, the core chips CC0 to CC3 are memory chips on which only circuit blocks belonging to the back-end section are integrated. Among the circuit blocks contained in the front-end section, a parallel-to-serial conversion circuit, which performs parallel-to-serial conversion of input/output data between a memory cell array and a data input/output terminal, a DLL (Delay Locked Loop) circuit, which controls an input/output timing of data, and the like are provided.

Meanwhile, the interface chip IF is a semiconductor chip on which only circuit blocks of the front-end section are integrated, among circuit blocks contained in a typical SDRAM that operates alone. The interface chip IF functions as a common front-end section for the four core chips CC0 to CC3. All accesses from the outside are conducted through the interface chip IF, and inputting and outputting of data are performed through the interface chip IF.

The interposer IP is a circuit board made of resin. On a back surface IPb thereof, a plurality of external terminals (solder balls) SB are formed. The interposer IP ensures the mechanical strength of the semiconductor device 10 and functions as a redistribution substrate (or a rewiring substrate) to expand an electrode pitch. That is, substrate electrodes 91 that are formed on a top surface IPa of the interposer IP are led out to the back surface IPb via through-hole electrodes 92; rewiring layers 93 that are provided on the back surface IPb are designed to expand the pitch of the external terminals SB. The areas of the top surface IPa of the interposer IP where no substrate electrode 91 is formed are covered with resist 90a. The areas of the back surface IPb of the interposer IP where no external terminal SB is formed are covered with resist 90b. FIG. 1 shows only five external terminals SB. However, a large number of external terminals is actually provided. The layout of the external terminals SB is the same as that of a SDRAM determined by the standard. Accordingly, an external controller can handle the external terminals SB as those of one SDRAM.

The gaps between the core chips CC0 to CC3 and interface chip IF stacked are filled with underfill 94. In this manner, the mechanical strength is ensured. The gap between the interposer IP and the interface chip IF is filled with NCP (Non-Conductive Paste) 95. The entire package is covered with mold resin 96. In this manner, each chip is physically protected.

The penetrating electrodes TSV provided in the core chips CC1 to CC3 and interface chip IF are arranged at a minimum pitch P0 that can be processed, or at a slightly wider pitch P0 than the minimum pitch, in order to curb an increase in the chip size. The value of the pitch P0 is for example about 40 to 50 μm. Meanwhile, the substrate electrodes 91 provided on the interposer IP are arranged at a minimum pitch P1 (>P0) that is allowed according to a layout rule of the interposer IP, or at a slightly wider pitch P1 (>P0) than the minimum pitch. The value of the pitch P1 is for example about 75 to 150 μm. Although not specifically limited, according to the present embodiment described later with reference to FIG. 7 and the subsequent drawings, the pitches are designed as follows: P1=P0×2. FIG. 1 shows eight penetrating electrodes TSV, which are arranged in lines T1 to T8 in the core chips CC1 to CC3 and interface chip IF, as well as top-surface bumps FB, which are arranged in lines T1 and T8 to T12 in the interface chip IF. However, greater numbers of penetrating electrodes TSV and top-surface bumps FB are actually provided. As shown in FIG. 1, the top-surface bumps FB provided on the interface chip IF are bonded to the substrate electrodes 91 on the interposer IP. However, as shown in FIG. 1, some of the top-surface bumps FB provided on the interface chip IF are not bonded to the substrate electrodes 91 on the interposer IP.

Most of the penetrating electrodes TSV provided on the core chips CC1 to CC3 are connected to the top-surface bumps FB and back-surface bumps BB that are provided at the same locations in planar view. According to the present embodiment, the penetrating electrodes of such a kind are represented by TSV1. In FIG. 1, the penetrating electrodes TSV1 of such a kind are shown in lines T1 to T8.

Figure 2:
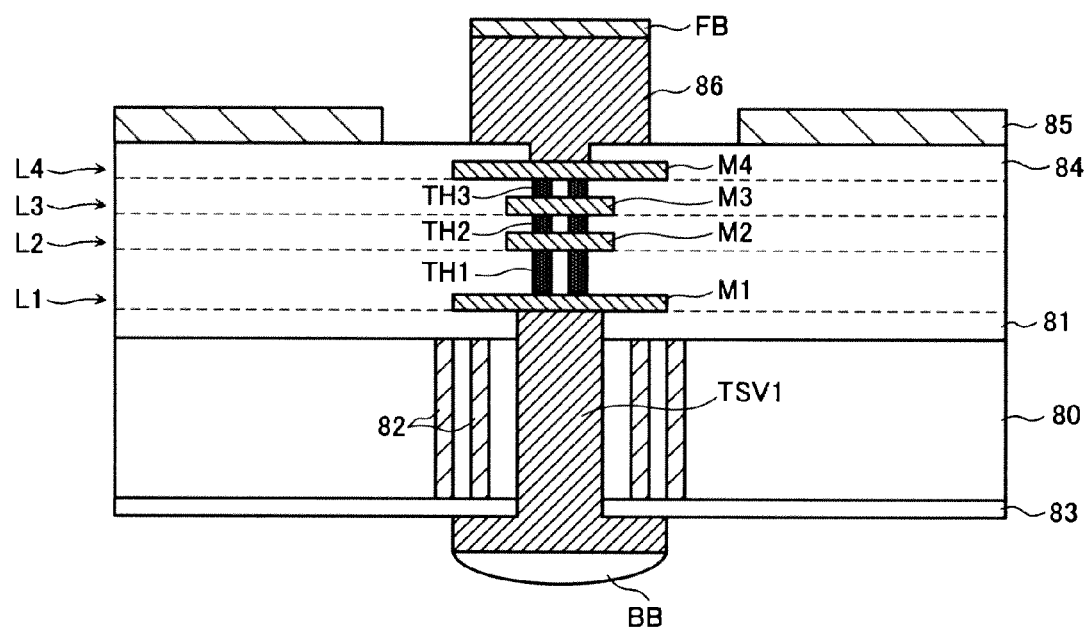
FIG. 2 is a cross-sectional view of a penetrating electrode TSV1.

Turning to FIG. 2, the penetrating electrode TSV1 is so provided as to pass through a silicon substrate 80, an interlayer insulation film 81, which is provided on a top surface of the silicon substrate 80, and a passivation film 83, which is provided on a back surface of the silicon substrate 80. Although not specifically limited, the penetrating electrode TSV1 is made of Cu (copper). The top surface of the silicon substrate 80 serves as a device formation surface on which devices such as transistors are formed. Around the penetrating electrode TSV1, insulation rings 82 are provided to insulate the penetrating electrode TSV1 from a transistor region. In the example shown in FIG. 2, two insulation rings 82 are provided to reduce capacitance between the penetrating electrode TSV1 and the silicon substrate 80. Incidentally, one insulation ring 82, instead of two, may be provided.

An end portion of the penetrating electrode TSV1 that is closer to the back surface of the silicon substrate 80 is covered with a back-surface bump BB. In the core chips CC1 to CC3, the back-surface bumps BB are in contact with the top-surface bumps FB provided on upper-layer core chips CC0 to CC2, respectively. In the interface chip IF, the back-surface bumps BB are in contact with the top-surface bumps FB provided on the core chip CC3. Although not specifically limited, the back-surface bumps BB are made of SnAg solder, which covers the surfaces of the penetrating electrodes TSV1 made of Cu (copper). The top-surface bump FB is connected to an end portion of the penetrating electrode TSV1 via pads M1 to M4, which are provided in wiring layers L1 to L4, and a plurality of through-hole electrodes TH1 to TH3, which connect the pads. In the core chips CC1 to CC3, the op-surface bumps FB are in contact with the back-surface bumps BB provided on the lower-layer core chips CC2 and CC3 and the interface chips IF, respectively. In the interface chip IF, the top-surface bumps FB are in contact with the substrate electrodes 91 on the interposer IP. Although not specifically limited, the top-surface bumps FB include a pillar portion 86 that is made of Cu (copper). A surface of the pillar portion 86 includes a structure in which layers of Ni (nickel) and Au (gold) are stacked. The diameter of the top-surface bumps FB and back-surface bumps BB is about 20 μm.

According to the above configuration, the top-surface bumps FB and back-surface bumps BB that are provided at the same locations in planar view are being short-circuited via the penetrating electrodes TSV1. The pillar portion 86 of a top-surface bump FB is so provided as to pass through a passivation film 84. A top surface of the passivation film 84 except a region where the top-surface bump FB is formed is covered with a polyimide film 85. Incidentally, the connection to internal circuits not shown in the diagram is realized via internal wires (not shown), which are led out from the pads M1 to M3 provided in the wiring layers L1 to L3.

In that manner, the penetrating electrodes TSV1 are connected to the top-surface bumps FB and back-surface bumps BB that are provided at the same locations in planar view. Accordingly, input signals (command signals, address signals, and other signals) that are supplied from the interface chip IF via the penetrating electrodes TSV1 are input into the core chips CC0 to CC3 in common. Output signals (such as data) that are supplied from the core chips CCC to CC3 via the penetrating electrodes TSV1 are subjected to a Wired-OR operation before being input into the interface chip IF.

Incidentally, in the interface chip IF, the penetrating electrodes TSV1 of such a kind are partially provided. FIG. 1 shows the penetrating electrodes TSV1 provided in lines T1 and T8 of the interface chip IF. The penetrating electrodes TSV1 provided on the interface chip IF are used mainly for supplying power supply potential VDD or VSS.

Most of the penetrating electrodes TSV provided on the interface chip IF are connected to the back-surface bumps BB that are provided at the same locations in planar view, but not connected to the top-surface bumps FB that are provided at the same locations in planar view. According to the present embodiment, the penetrating electrodes of such a kind are represented by TSV2. In FIG. 1, the penetrating electrodes TSV2 provided on the interface chip IF are shown in lines T2 to T7.

Figure 3:
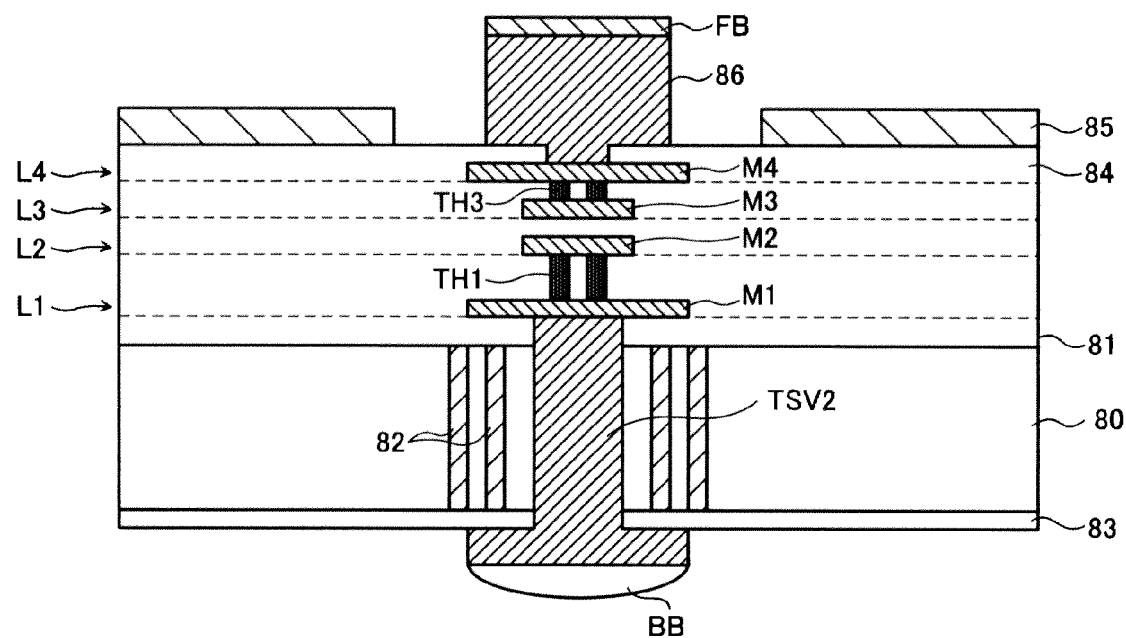
FIG. 3 is a cross-sectional view of a penetrating electrode TSV2.

Turning to FIG. 3, the penetrating electrode TSV2 is different from the penetrating electrode TSV1 shown in FIG. 2 in that a through-hole electrode TH2, which is designed to connect the pads M2 and M3 placed at the same plane position, has been removed. Therefore, the top-surface bump FB and back-surface bump BB that are placed at the same plane position are not short-circuited. The penetrating electrodes TSV2 provided on the interface chip IF are used mainly for transmitting or receiving signals. That is, signals output from the internal circuits (not shown) in the interface chip IF are supplied to the pad M1 or M2, and are supplied to the core chips CC0 to CC3 via the back-surface bumps BB. Signals output from the core chips CC0 to CC3 are supplied to the pad M1 or M2 via the back-surface bumps BB, and are input into the internal circuits (not shown) in the interface chip IF. The penetrating electrodes TSV2 are electrodes that are bonded to the top-surface bumps FB provided on the core chip CC3. Therefore, the array pitch thereof is so designed as to be P0.

Figure 4:
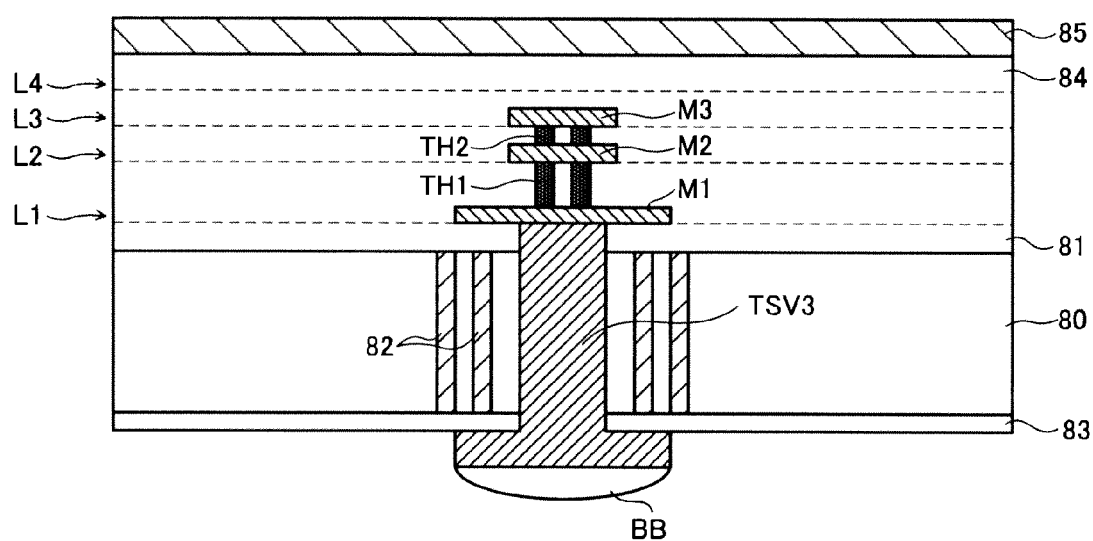
FIG. 4 is a cross-sectional view of a penetrating electrode TSV3.

Incidentally, the top-surface bumps FB of the penetrating electrodes TSV2 shown in lines T2 to T7 are not bonded to the substrate electrodes 91 on the interposer IP. In such a case, there is no need to provide the top-surface bumps FB; as in the case of a penetrating electrode TSV3 shown in FIG. 4, the top-surface bumps FB may be removed.

Although not shown in the diagram, some of the above-described penetrating electrodes TSV2 are used in the core chips CC1 to CC3. The penetrating electrodes TSV2 provided on the core chips CC1 to CC3 are used to sequentially transfer predetermined information to the internal circuits (not shown) provided on each of the core chips CC0 to CC3, and to input unique information. The information includes chip address information, defective chip information, and the like.

Furthermore, on the interface chip IF, top-surface bumps FBa on which penetrating electrodes TSV are not provided at the same plane positions are provided, too. In FIG. 1, the top-surface bumps FBa provided on the interface chip IF are shown in Lines T9 to T12.

Figure 5:
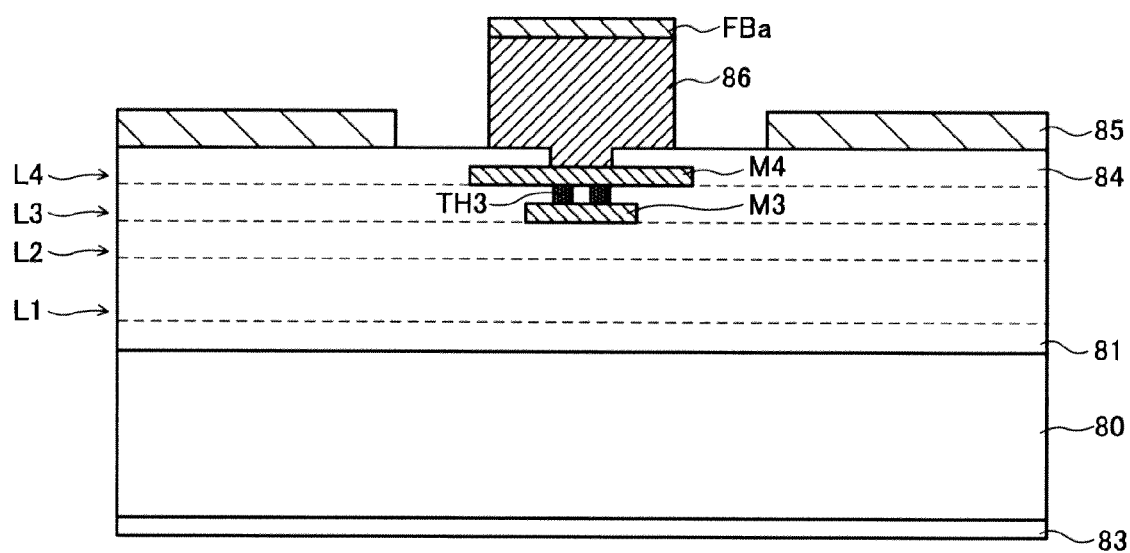
FIG. 5 is a cross-sectional view of a top-surface bump shown in FIG. 1.

Turning to FIG. 5, top-surface bump FBa provided on the interface chip IF is connected to the pads M4 and M3. Below the pads M4 and M3, the pads M2 and M1, the penetrating electrodes TSV, and the back-surface bump BB are not provided. The pads M4 and M3 are connected to logic circuits and other circuits in the interface chip IF, which are not shown in the diagram. The top surface bump FBa is an electrode bonded to a substrate electrode 91 on the interposer IP. Therefore, the array pitch thereof is so designed as to be P1.

A procedure of producing the semiconductor device 10 shown in FIG. 1 will be described below. First, the core chip CC0 is placed on a stage of a flip chip bonder in a face-up manner. The position thereof is recognized with the help of an alignment mark put on the surface of the chip. Then, a flip chip bonding tool is used to pick up the principal surface of the core chip CC1, or the surface on which the top-surface bumps FB are formed. The position of the core chip CC1 that is picked up is recognized with the help of an alignment mark put on the back surface thereof. After the positions of the core chips CC0 and CC1 have been recognized, the core chip CC1 is stacked on the core chip CC0 in a face-up manner in such a way that the top-surface bumps FB of the core chip CC0 are accurately placed on the back-surface bumps BB of the core chip CC1.

Then, the position of the core chip CC1 is recognized with the help of an alignment mark put on the surface of the chip. A flip chip bonding tool is used to pick up the core chip CC2. The same procedure is used to stack the core chip CC2 on the core chip CC1 in a face-up manner. Similarly, the core chip CC3 and the interface chip IF are stacked in that order.

After the interface chip IF is stacked, in order to fill the gaps between the chips, the underfill 94 is injected from the sides. Then, pressurization baking or the like is performed to cure the underfill 94.

Then, the substrate electrodes 91 are formed on the top surface IPa of the interposer IP. For example, it is preferred that stud bump made of gold (Au) be used as the substrate electrodes 91. Then, on a stage of a flip chip bonder, the interposer IP is placed, and the NCP (Non-Conductive Paste) 95 is applied to the top surface IPa on which the substrate electrodes 91 are formed. In this state, a laminated body made up of the core chips CC0 to CC3 and the interface chip IF, which is prepared in advance, is stacked on the interposer IP in such a way that the top-surface bumps FB are accurately placed on the substrate electrodes 91. Then, a process of heating the NCP 95 or any other process is performed to cure the NCP 95. After that, all the components are covered with the mold resin 96, and external terminals (solder balls) SB are formed on the back surface IPb of the interposer IP. In this manner, the semiconductor device 10 shown in FIG. 1 is completed.

Among the above-described production processes, a process of stacking the core chips CC0 to 003 and the interface chip IF is performed in the state that the temperature of the flip chip bonding tool is set to 300 degrees Celsius, for example. The temperature is a temperature necessary to bond the top-surface bumps FB to the back-surface bumps BB. A decrease in the temperature leads to a decline in bonding strength. Ideally, it is desirable that the semiconductor chip that is picked up be evenly heated at about 300 degrees Celsius. However, the periphery of the chip actually tends to decrease in temperature. One of the reasons is that the formation density of high thermal-conductivity penetrating electrodes TSV is low at the periphery of the chip. Consequently, as the semiconductor chip is warped due to heating of the flip chip bonding tool, a bonding failure is likely to occur at the periphery of the chip. Moreover, in an area where the formation density of the penetrating electrodes TSV is low, the adhesion between the upper and lower semiconductor chips also becomes smaller. As a result, the chips can easily come off due to warping of the chips.

The semiconductor device 10 of the present embodiment is able to prevent the occurrence of such a bonding failure in an effective manner. While the details will be described later, the reason is that dummy penetrating electrodes are disposed in an area where the formation density of the penetrating electrodes TSV is low, thereby increasing the bonding strength. Hereinafter, the planar configuration of the core chips CC0 to CC3 and the interface chip IF will be described in more detail.

Figure 6:
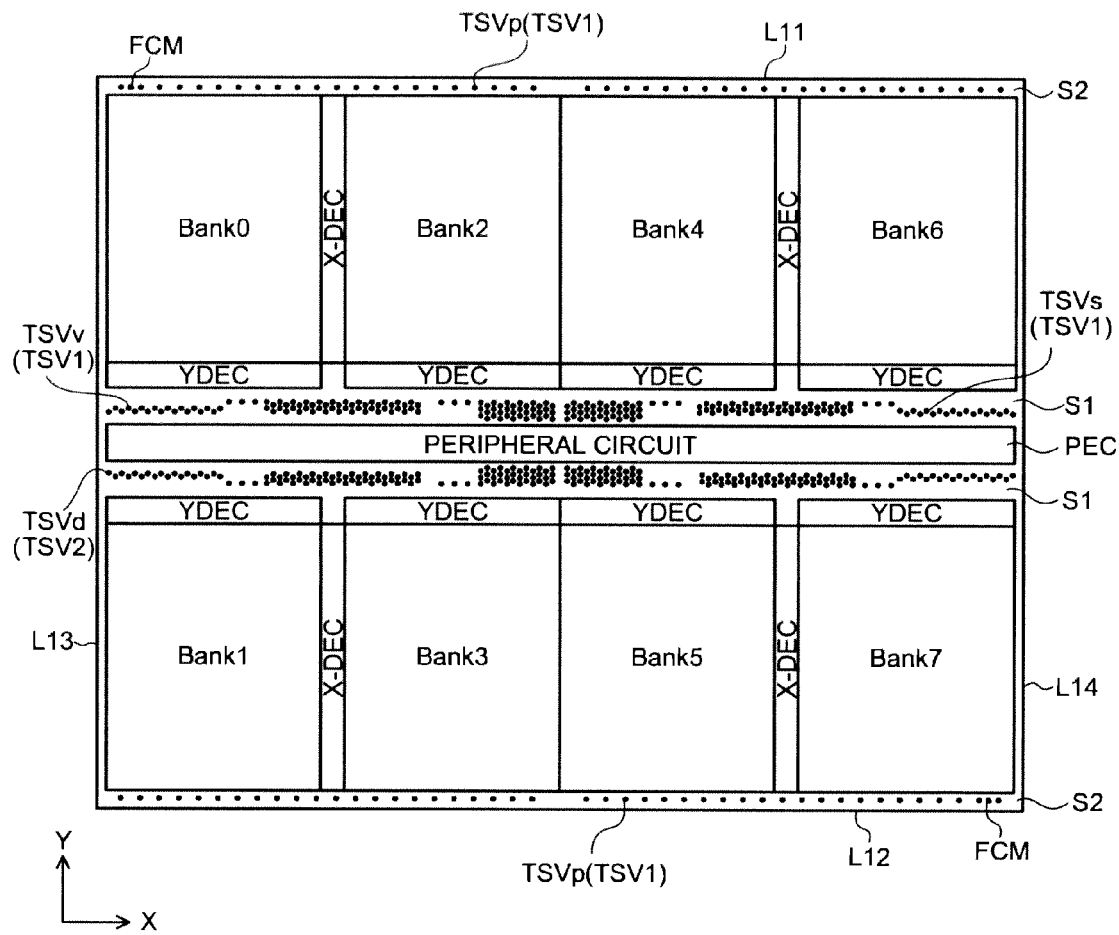
FIG. 6 is a schematic top view of a layout of core chips CC1 to CC3 shown in FIG. 1.

Turning to FIG. 6, the core chips CC1 to CC3 each have eight memory banks BANK0 to BANK7. The even-numbered memory banks BANK0, 2, 4, and 6 are disposed in an X-direction along one side L11 in a Y-direction of each of the core chips CC1 to CC3. The odd-numbered memory banks BANK 1, 3, 5, and 7 are disposed in the X-direction along the other side L12 in the Y-direction of each of the core chips CC1 to CC3. Moreover, between the banks that are adjacent to each other in the X-direction, row decoders XDEC are disposed to perform row access. Between the banks that are adjacent to each other in the Y-direction, column decoders YDEC are disposed to perform column access.

In a central portion of the chip in the Y-direction, called peripheral circuits PEC are disposed. Among the peripheral circuits PEC, a logic circuit, a power supply circuit, an input/output circuit, and the like are provided. In regions S1 between the peripheral circuits PEC and the column decoders YDEC, a large number of penetrating electrodes TSV are disposed. The penetrating electrodes disposed in the regions S1 are mainly made up of penetrating electrodes TSVv for power supply, and penetrating electrodes TSVs for signals. For the power-supply penetrating electrodes TSVv, penetrating electrodes TSV1 having the configuration shown in FIG. 2 are used. For the signal penetrating electrodes TSVs, penetrating electrodes TSV1 having the configuration shown in FIG. 2 or penetrating electrodes TSV2 having the configuration shown in FIG. 3 are used. While the details will be described later, dummy penetrating electrodes TSVd, too, are provided in the area according to the present embodiment. The dummy penetrating electrodes TSVd are disposed near the sides L13 and L14 in the X-direction of the chip.

In regions S2 that extend along the sides L11 and L12 of the chip, penetrating electrodes TSVp for support, and alignment marks FCM are provided. The support penetrating electrodes TSVp are provided to prevent the gaps between the chips from becoming narrower due to warping of the chips. For the support penetrating electrodes TSVp, penetrating electrodes TSV1 having the configuration shown in FIG. 2 are used. The alignment marks FCM are made up of pads M4 which are provided on the top-layer wiring layers L4 for the principal surfaces' sides of the chips, and the alignment marks FCM are made up of the back-surface bumps BB for the back surfaces' sides of the chips. The back-surface bumps BB that constitute the alignment marks FCM are formed integrally with the penetrating electrodes TSV3 shown in FIG. 4.

Incidentally, the top-layer core chip CC0 basically has the same configuration as the core chips CC1 to CC3 shown in FIG. 6. However, as already mentioned above, no penetrating electrode TSV is provided on the core chip CC0. Therefore, no back-surface bump BB is provided on the core chip CC0. The layout of the top-surface bumps FB is the same as the layout shown in FIG. 6.

Figure 7:
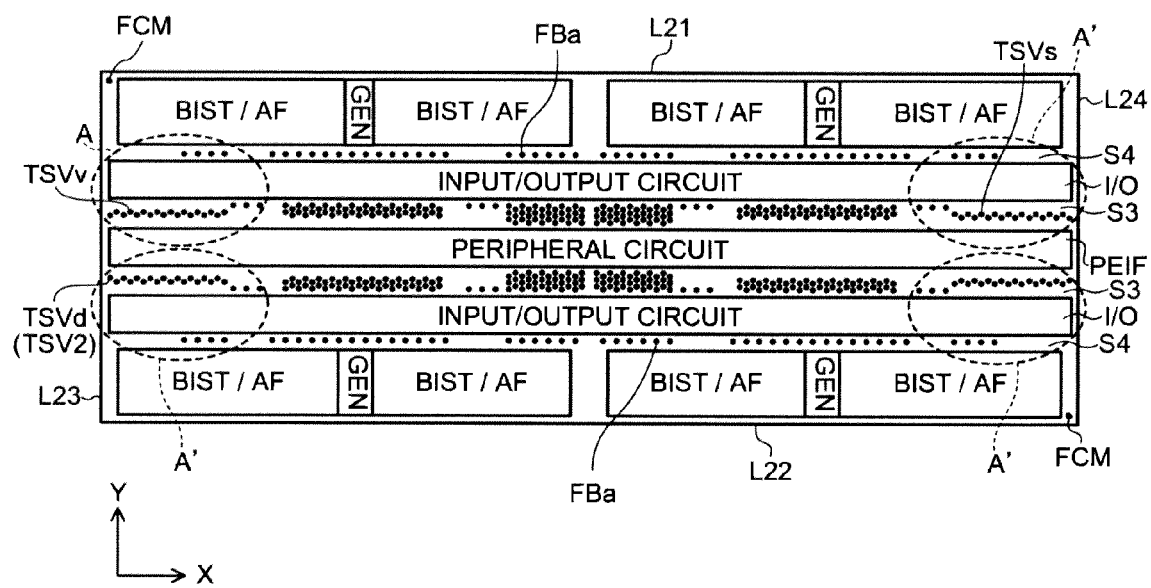
FIG. 7 is a schematic top view of a layout of an interface chip IF.

Turning to FIG. 7, in a central portion in the Y-direction of the interface chip IF, so-called peripheral circuits PEIF are disposed. Among the peripheral circuits PEIF, a logic circuit, a power supply circuit, a DLL circuit, and the like are provided. In regions S3 on both sides in the Y-direction of the peripheral circuits PEIF, a plurality of penetrating electrodes TSV are so disposed that the peripheral circuits PEIF are sandwiched therebetween. The layout of the penetrating electrodes TSV disposed in the regions S3 is the same as the layout of the penetrating electrodes TSV disposed in the regions S1 of the core chips CC1 to CC3. The penetrating electrodes TSV disposed in the regions S3 are mainly made up of penetrating electrodes TSVv for power supply, and penetrating electrodes TSVs for signals. For the power-supply penetrating electrodes TSVv, penetrating electrodes TSV1 having the configuration shown in FIG. 2 are used. For the signal penetrating electrodes TSVs, penetrating electrodes TSV2 having the configuration shown in FIG. 3 are used. While the details will be described later, dummy penetrating electrodes TSVd, too, are provided in the area according to the present embodiment. The dummy penetrating electrodes TSVd are disposed near the sides L23 and L24 in the X-direction of the chip.

Outside the regions S3 in the Y-direction, input/output circuits I/O are disposed. In regions S4 outside the input/output circuits I/O in the Y-direction, top-surface bumps FBa are so provided as to be connected to the interposer IP. The top-surface bumps FBa provided in the regions S4 have the configuration shown in FIG. 5. The pitch of the top-surface bumps FBa provided in the regions S4 is pitch P1 that is allowed according to the wiring rule of the interposer IP, and is larger than the array pitch P0 of the penetrating electrodes TSV.

On the interface chip IF, along the sides L21 and L22 of the chip, test circuits BIST, anti-fuse elements AF, power supply circuits GEN, and other circuits are disposed. In diagonal regions of the chip, alignment marks FCM are provided. As shown in FIG. 7, the Y-direction size of the interface chip IF is smaller than the Y-direction size of the core chips CC0 to CC3. The interface chip IF is unlikely to be warped. Therefore, unlike the core chips CC1 to CC3, the support penetrating electrodes TSV are not provided along the sides L21 and L22 of the chip.

Figure 8:
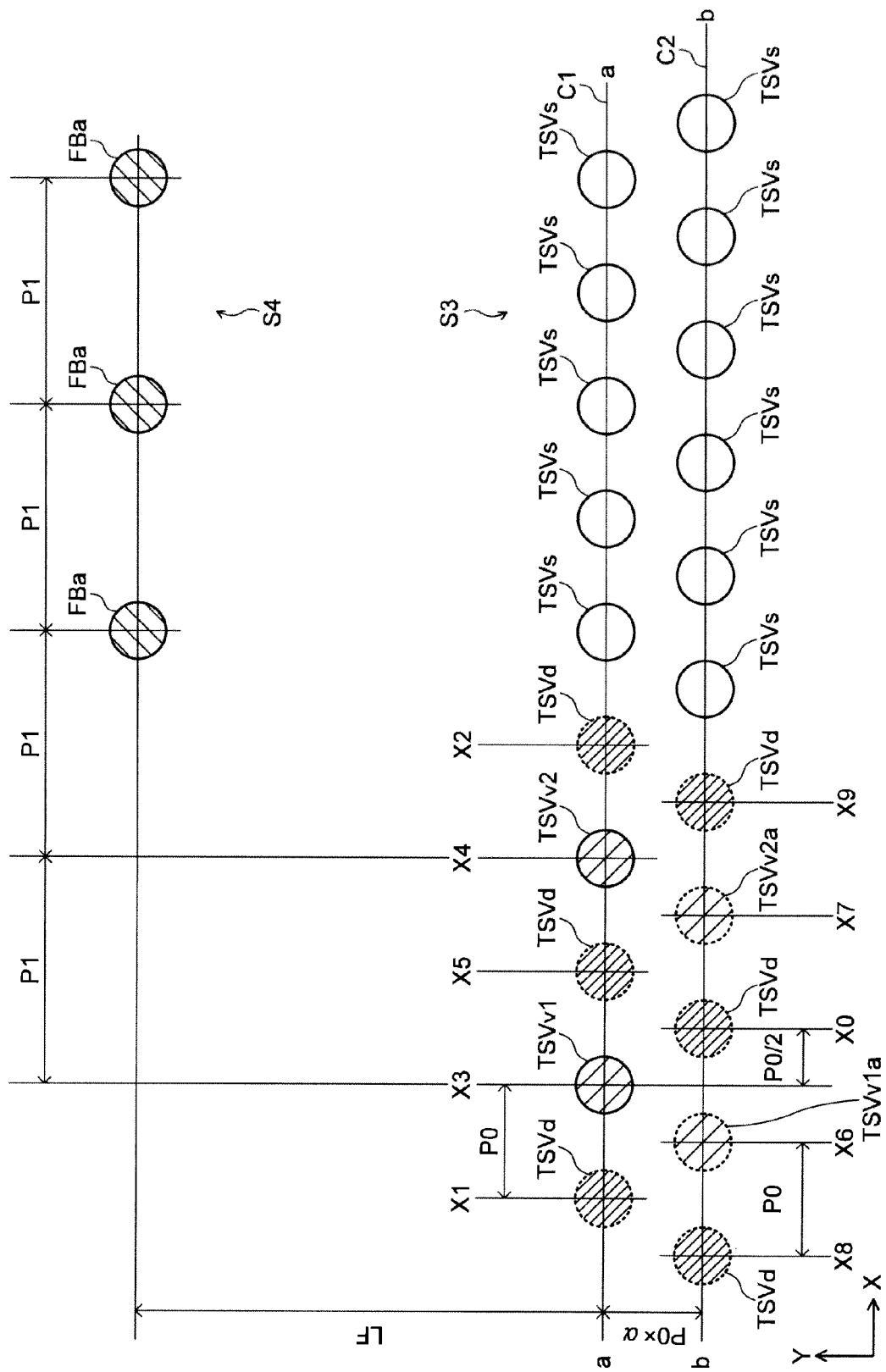
FIG. 8 is a layout chart of penetrating electrodes TSV and top-surface bumps FB disposed in regions A shown in FIG. 7 according to a first embodiment of the present invention.
Figure 18:
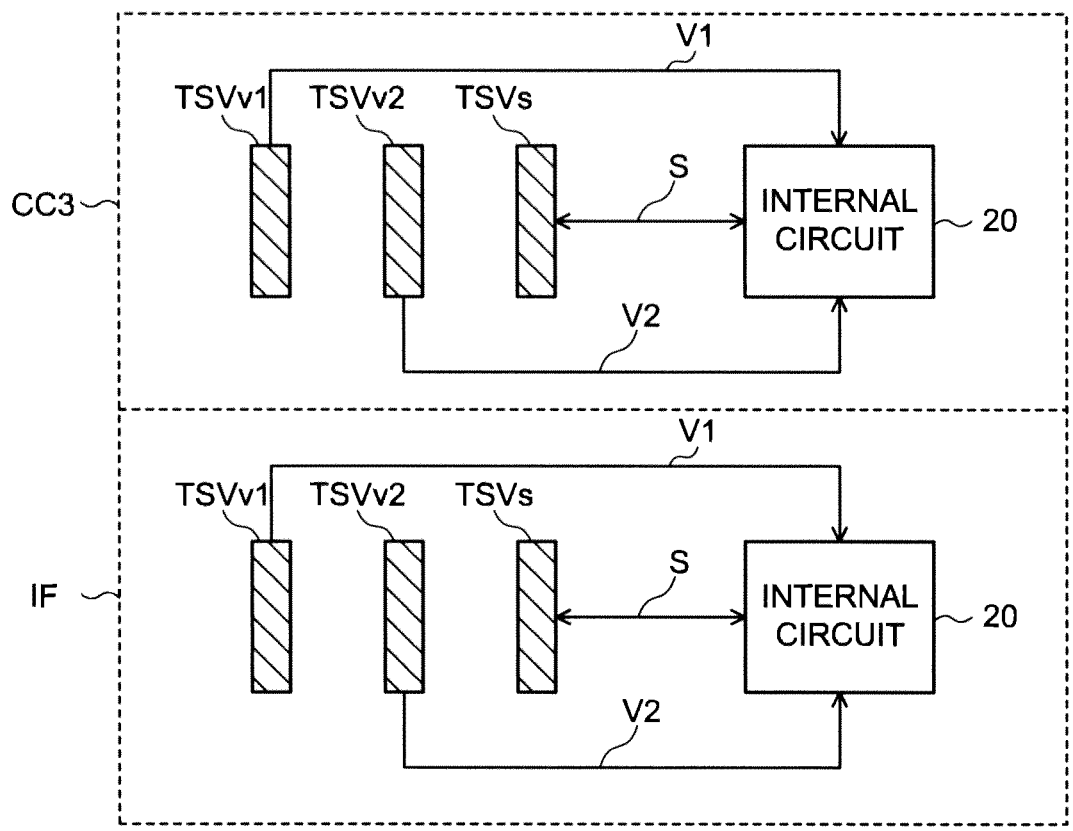
FIG. 18 is a schematic diagram indicative of an embodiment of the connection relationship between power-supply penetrating electrodes TSVv1 and TSVv2, signal penetrating electrodes TSVs, and internal circuits 20.

Turning to FIG. 8, the region S3 contains penetrating electrodes TSVv1 and TSVv2 for power supply, penetrating electrodes TSVs for signals, dummy penetrating electrodes TSVd, and penetrating electrodes TSVv1$a$ and TSVv2$a$ for power supply assistance. FIG. 8 is a top view seen from the principal surface's side of the interface chip IF. Therefore, the top-surface bumps FB are actually confirmed in the region S3. However, for ease of explanation, the top-surface bumps FB are regarded as penetrating electrodes in the following description. Turning to FIG. 18, in each of the core chip CC3 and the interface chip IF, the internal circuit 20 is powered by power supply potential VDD, which is supplied via a power supply line V1, and power supply potential VSS, which is supplied via a power supply line V2, to operate and a signal is input and output via a signal line S. As shown in FIG. 18, the penetrating electrodes TSVv1 and TSVv2 are connected to the power supply lines V1 and V2, respectively, and the penetrating electrode TSVs is connected to the signal line S. The same is true for the upper-layer core chips CC1 and CC2.

Returning to FIG. 8, the planar layout will be described. The top-surface bumps FBa formed in the region S4 have the configuration shown in FIG. 5. Immediately below the top-surface bumps FBa, no penetrating electrode TSV is provided. The distance LF between the regions S3 and S4 in the Y-direction is determined based on the size and precision of a flip chip bonding tool used for flip-chip stacking. The reason is that, at the time of flip-chip stacking, the flip chip bonding tool needs to stick fast to an area where no top-surface bump FB is provided. In one example, the distance LF is about 200 to 500 μm.

Although not specifically limited, the X-coordinates of the penetrating electrodes TSV that are provided along line a-a are shifted by half a pitch (=P0/2) from the X-coordinates of the penetrating electrodes TSV that are provided along line b-b. The distance between lines a-a and b-b in the Y-direction is so designed as to be α times as large as the pitch P0. In one example, if α is √3/2, penetrating electrodes TSV are laid out at apexes of an equilateral triangle. Therefore, closest packing is possible. In this case, the pitch of the penetrating electrodes TSV on line a-a and the penetrating electrodes TSV on line b-b is P0.

Figure 9:
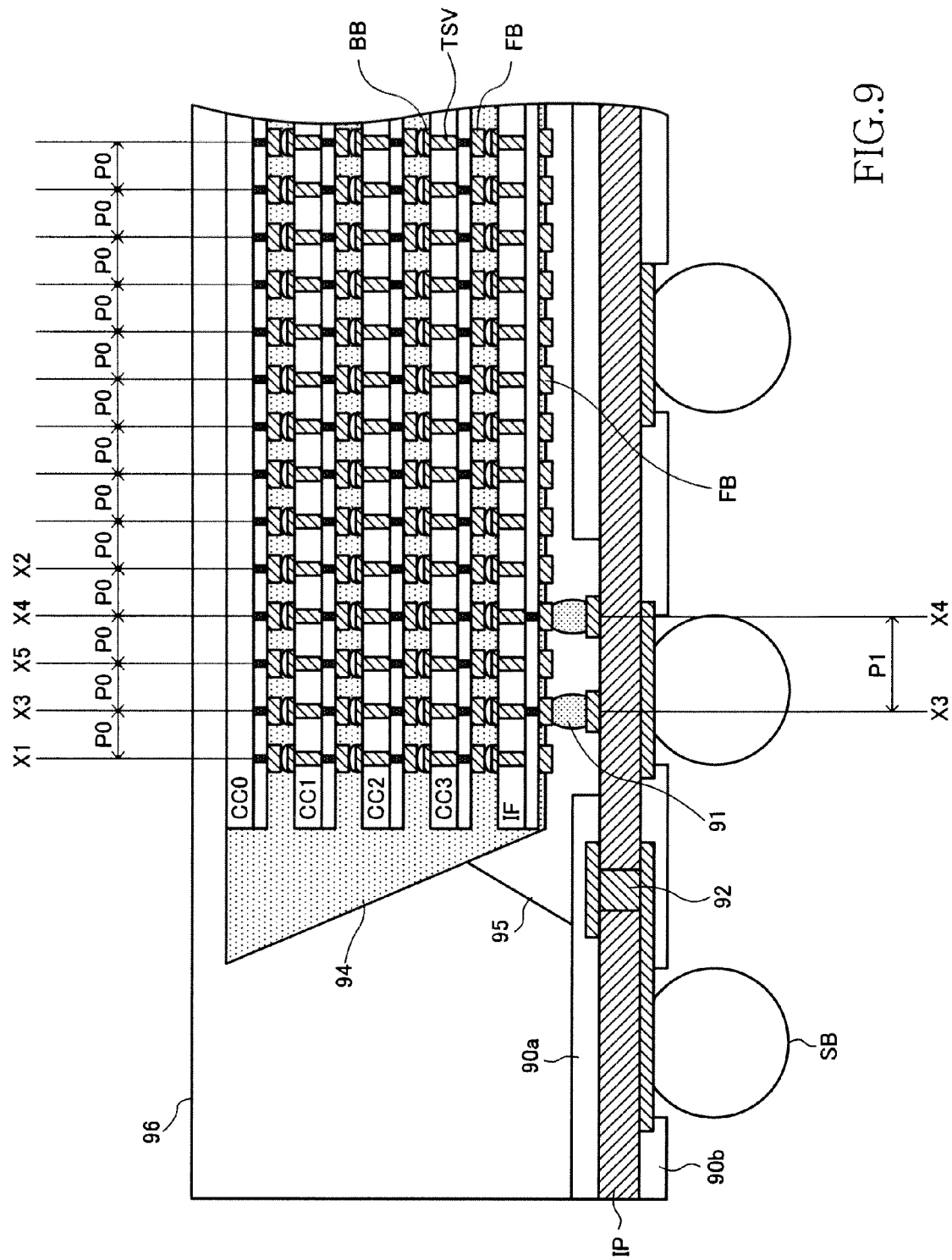
FIG. 9 is a cross-sectional view of FIG. 8 taken along line a-a (line C1) shown in FIG. 8.

The power-supply penetrating electrodes TSVv1 and TSVv2 are penetrating electrodes TSV1 having the configuration shown in FIG. 2. As shown in FIG. 9, which is a cross-sectional view, the power-supply penetrating electrodes TSVv1 and TSVv2 are bonded to the substrate electrodes 91 on the interposer IP via the top-surface bumps FB. Moreover, the power-supply penetrating electrodes TSVv1 and TSVv2 are bonded to the corresponding top-surface bumps FB of the upper-layer core chips CC3 via the back-surface bumps BB. In this case, the penetrating electrodes TSVv1 are penetrating electrodes for supplying high-level power supply potential VDD, and are connected to power supply lines that supply the high-level power supply potential VDD to internal circuits such as peripheral circuits PEIF. The penetrating electrodes TSVv2 are penetrating electrodes for supplying low-level power supply potential VSS, and are connected to power supply lines that supply the low-level power supply potential VSS to internal circuits such as peripheral circuits PEIF. The penetrating electrodes TSVv1 and TSVv2 are bonded to the substrate electrodes 91 on the interposer IP via the top-surface bumps FB. Therefore, the penetrating electrodes TSVv1 and TSVv2 are arranged with a pitch of P1.

Figure 10:
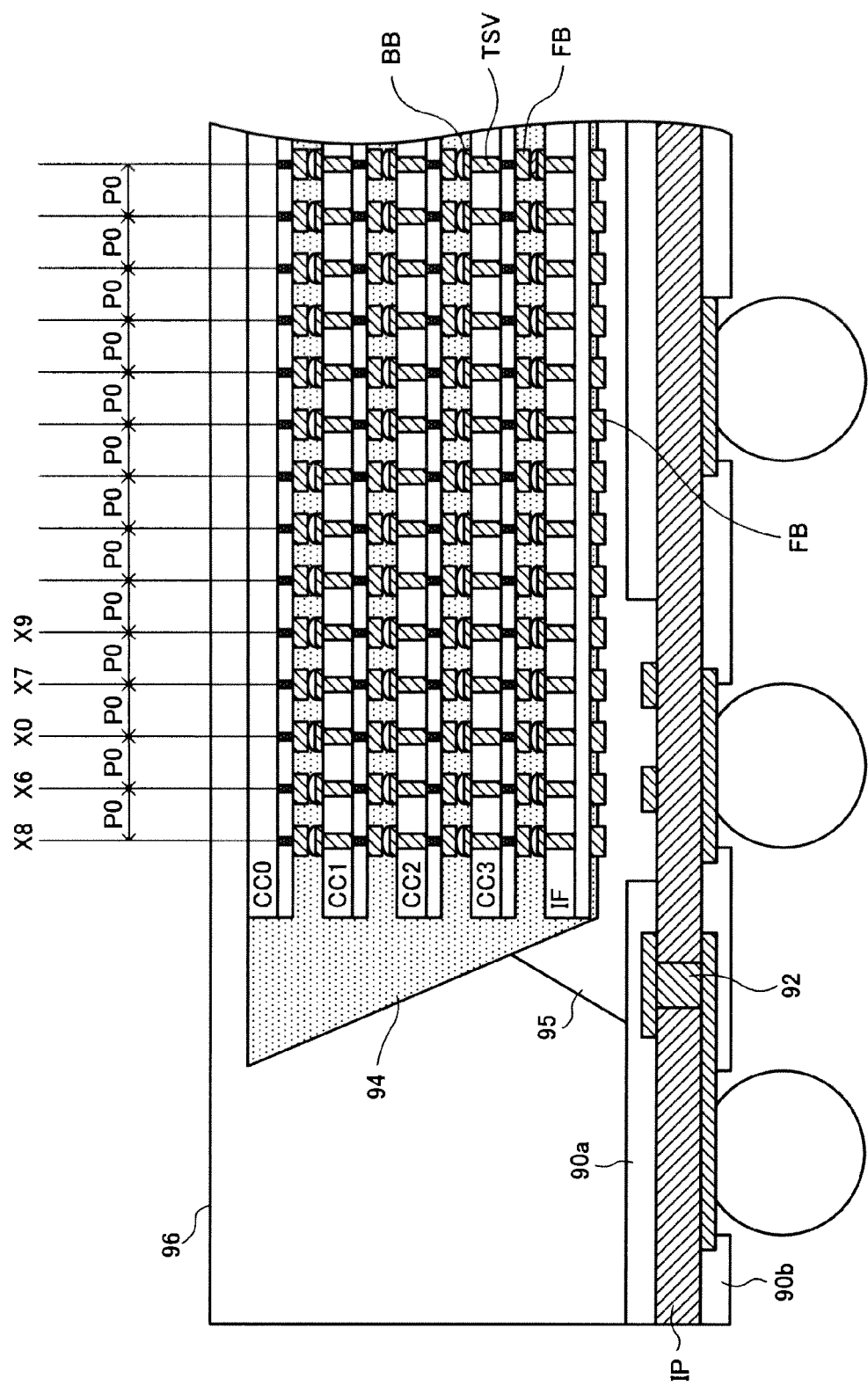
FIG. 10 is a cross-sectional view of FIG. 8 taken along line b-b (line C2) shown in FIG. 8.

The signal penetrating electrodes TSVs are penetrating electrodes TSV2 having the configuration shown in FIG. 3. As shown in FIGS. 9 and 10, the signal penetrating electrodes TSVs are not bonded directly to the substrate electrodes 91 on the interposer IP. The signal penetrating electrodes TSVs are bonded to the corresponding top-surface bumps FB of the upper-layer core chip CC3 via the back-surface bumps BB. In this manner, the signal penetrating electrodes TSVs are penetrating electrodes for connecting the chips to each other. Therefore, the signal penetrating electrodes TSVs are disposed with a pitch of P0.

The dummy penetrating electrodes TSVd are penetrating electrodes TSV2 having the configuration shown in FIG. 3. As shown in FIGS. 9 and 10, the dummy penetrating electrodes TSVd are not bonded directly to the substrate electrodes 91 on the interposer IP. The dummy penetrating electrodes TSVd are bonded to the corresponding top-surface bumps FB of the upper-layer core chip CC3 via the back-surface bumps BB. The dummy penetrating electrodes TSVd are not connected to any internal circuit in the interface chip IF, and are in the state of floating. As shown in FIG. 6, even on the core chips CC1 to CC3, at the same plane positions as the dummy penetrating electrodes TSVd provided on the interface chip IF, dummy penetrating electrodes TSVd are provided. As shown in FIGS. 9 and 10, the dummy penetrating electrodes TSVd provided on the core chips CC1 to CC3 are penetrating electrodes TSV1 having the configuration shown in FIG. 2. The dummy penetrating electrodes TSVd provided on the core chips CC1 to CC3, too, are not connected to any internal circuit in the core chips CC1 to CC3, and are in the state of floating. However, for the dummy penetrating electrodes TSVd provided on the core chips CC1 to CC3, the penetrating electrodes TSV2 having the configuration shown in FIG. 3 may be used.

As shown in FIG. 8, on line a-a, three dummy penetrating electrodes TSVd are so provided that the power-supply penetrating electrodes TSVv1 and TSVv2 are sandwiched therebetween. According to the present invention, among the penetrating electrodes TSV disposed on line a-a, the penetrating electrodes TSV disposed on coordinates X1 to X5 may be referred to as first to fifth penetrating electrode respectively. Among the penetrating electrodes TSV provided on the upper-layer core chip CC3, the penetrating electrodes TSV that are so disposed as to overlap with the penetrating electrodes TSV disposed on coordinates X1 to X4 in planar view may be referred to as tenth to thirteenth penetrating electrodes, respectively.

The power supply assistance penetrating electrodes TSVv1a and TSVv2a are penetrating electrodes TSV2 having the configuration shown in FIG. 3. As shown in FIG. 10, which is a cross-sectional view, the power supply-assistance penetrating electrodes TSVv1a and TSVv2a are not bonded to the substrate electrodes 91 on the interposer IP via the top-surface bumps FB. However, inside the interface chip IF, the power supply-assistance penetrating electrodes TSVv1a and TSVv2a are connected to the power-supply penetrating electrodes TSVv1 and TSVv2, respectively. The power supply-assistance penetrating electrodes TSVv1a and TSVv2a may not be provided. However, if the power supply-assistance penetrating electrodes TSVv1a and TSVv2a are provided, it is possible to make power-supply main lines thicker in the interface chip IF, thereby lowering the resistance of the power-supply lines. Moreover, the power supply-assistance penetrating electrodes TSVv1a and TSVv2a function as bypass routes the power-supply lines between the chips, making it possible to increase reliability.

As shown FIG. 8, on line b-b, one power supply-assistance penetrating electrode TSVv1a and one power supply-assistance penetrating electrode TSVv2a are provided with a pitch of P1. The power supply-assistance penetrating electrodes TSVv1a and TSVv2a are disposed next to the power-supply penetrating electrodes TSVv1 and TSVv2, respectively, which are provided on line a-a. Three dummy penetrating electrodes TSVd are provided on line b-b in such a way that the power supply-assistance penetrating electrodes TSVv1a and TSVv2a are sandwiched therebetween. According to the present invention, among the penetrating electrodes TSV disposed online b-b, the penetrating electrodes TSV disposed on coordinates X6 to X9 may be referred to as sixth to ninth penetrating electrodes, respectively.

In that manner, the power-supply penetrating electrodes TSVv1 and TSVv2 provided on line a-a are bonded to the substrate electrodes 91 on the interposer IP. Therefore, the array pitch thereof is P1. However, the dummy penetrating electrodes TSVd are so provided that the above electrodes are sandwiched therebetween. Therefore, the array pitch of the penetrating electrodes TSV on line a-a is P0 even in the vicinity of the side L23. On line b-b, the power supply-assistance penetrating electrodes TSVv1a and TSVv2a are provided, and the dummy penetrating electrodes TSVd are so provided that the above electrodes are sandwiched therebetween. Therefore, the array pitch of the penetrating electrodes TSV on line b-b is P0 even in the vicinity of the side L23.

The above configuration increases the formation density of the penetrating electrodes TSV in the vicinity of the side L23, leading to an increase in thermal conductivity at the time of flip-chip stacking. The reason is that the penetrating electrodes TSV are made of metal (e.g. copper), which is higher in thermal conductivity than silicon that is used to make the semiconductor chips. At the peripheries of the chips, a connection failure can occur between the upper and lower chips due to warping of the chips. However, according to the present embodiment, at the peripheries of the chips, the formation density of the penetrating electrodes TSV has been increased, resulting in an increase in bonding strength between the chips. Therefore, even if the chips become warped to a certain extent, the possibility is low that the bond sections between the chips would be broken.

A connection failure that could occur at the peripheries of the chips is more likely to occur in areas closer to the sides of the chips. However, according to the present embodiment, the dummy penetrating electrodes TSVd closest to the sides of the chips are in the state of floating. Therefore, even if a connection failure occurs on the dummy penetrating electrodes TSVd, the dummy penetrating electrodes TSVd do not have an influence on the internal circuits. Even if the dummy penetrating electrodes TSVd come in contact with other unintended electrodes and the like, the dummy penetrating electrodes TSVd do not have an influence on the internal circuits.

While the above description focuses on the region A shown in FIG. 7, regions A' that are positioned close to the side L23 or L24 have a similar configuration. While the above description focuses on the interface chip IF, the same layout as that of the penetrating electrodes TSV that are so provided as to overlap with the regions A and A' in planar view is used in the core chips CC1 to CC3. Accordingly, an improvement in thermal conductivity at the time of flip-chip stacking, and an improvement in bonding strength against warping of the chips can be achieved not only between the interface chip IF and the core chip CC3, but also between the core chips CC0 to CC3. Therefore, the reliability of the product can be improved. Moreover, the dummy penetrating electrodes TSVd and the power supply-assistance penetrating electrodes TSVv1a and TSVv2a are disposed in a free space where the penetrating electrodes TSV are originally not provided, thereby avoiding an increase in the chip size.

The following describes a second embodiment of the present invention.

Figure 11:
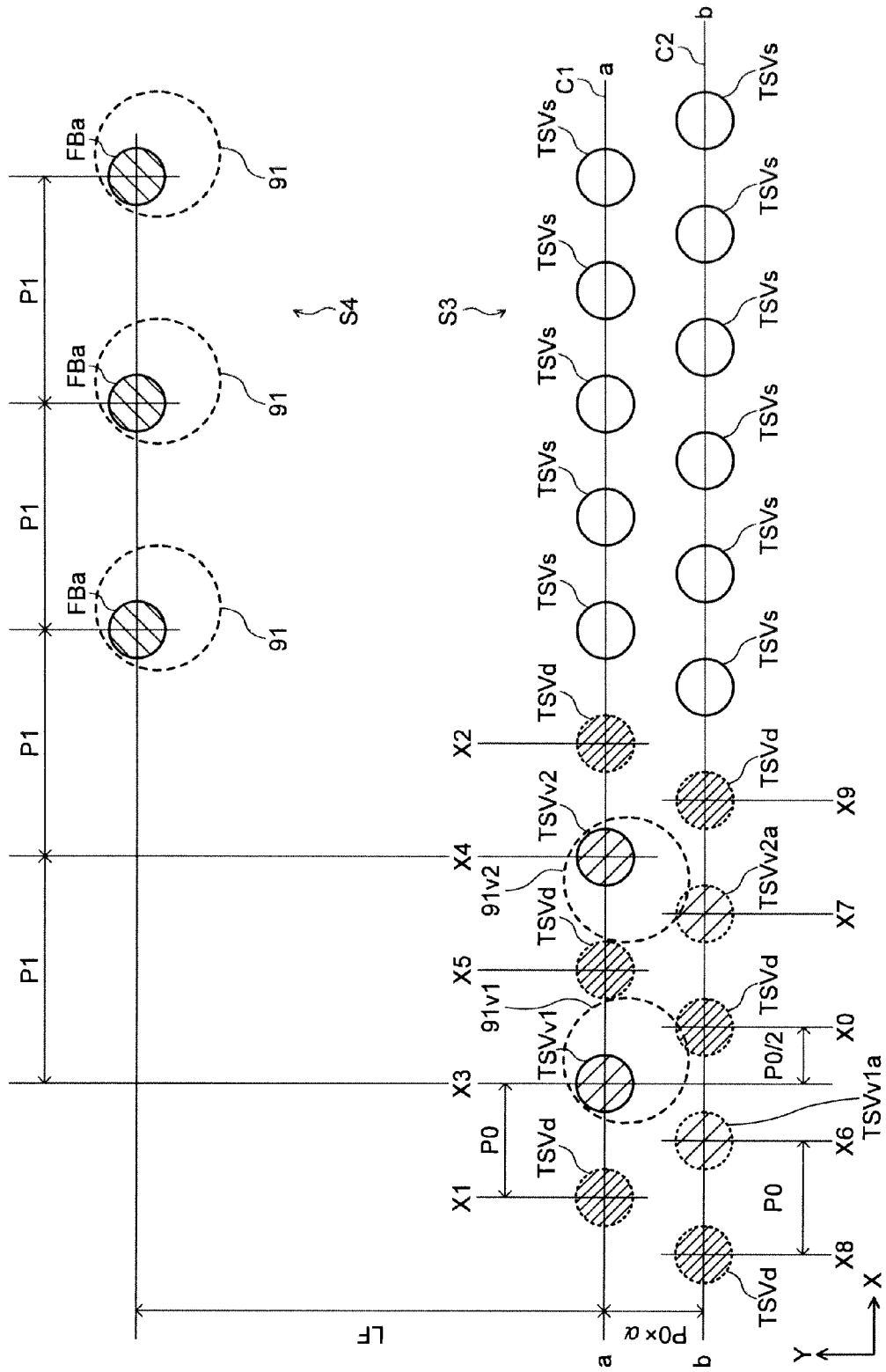
FIG. 11 is a diagram for explaining problems that could arise when displacement of substrate electrodes 91 occurs on an interposer IP in the case of the layout shown in FIG. 8.

The positional accuracy of the substrate electrodes 91 on the interposer IP is lower than the positional accuracy of the penetrating electrodes TSV. Therefore, displacement of the substrate electrodes 91 can occur relative to the penetrating electrodes TSV. FIG. 11 shows the situation where the distance between a substrate electrode 91v1, which should be bonded to the penetrating electrode TSVv1, and a substrate electrode 91v2, which should be bonded to the penetrating electrode TSVv2, is shorter than a design value. If the substrate electrodes 91 remain displaced as described above during the process of stacking the chips, as shown in FIG. 11, there is a risk that the two substrate electrodes 91v1 and 91v2 come in contact with the same dummy penetrating electrode TSVd. The power supply potential VDD is supplied to the penetrating electrode TSVv1, and the power supply potential VSS to the penetrating electrode TSVv2. Therefore, if the two come in contact with each other via the dummy penetrating electrode TSVd, the power supply is short-circuited, and the product becomes defective. Such a phenomenon can occur when the distance between the substrate electrodes 91v1 and 91v2 is narrower than the diameter of the dummy penetrating electrode TSVd.

Figure 12:
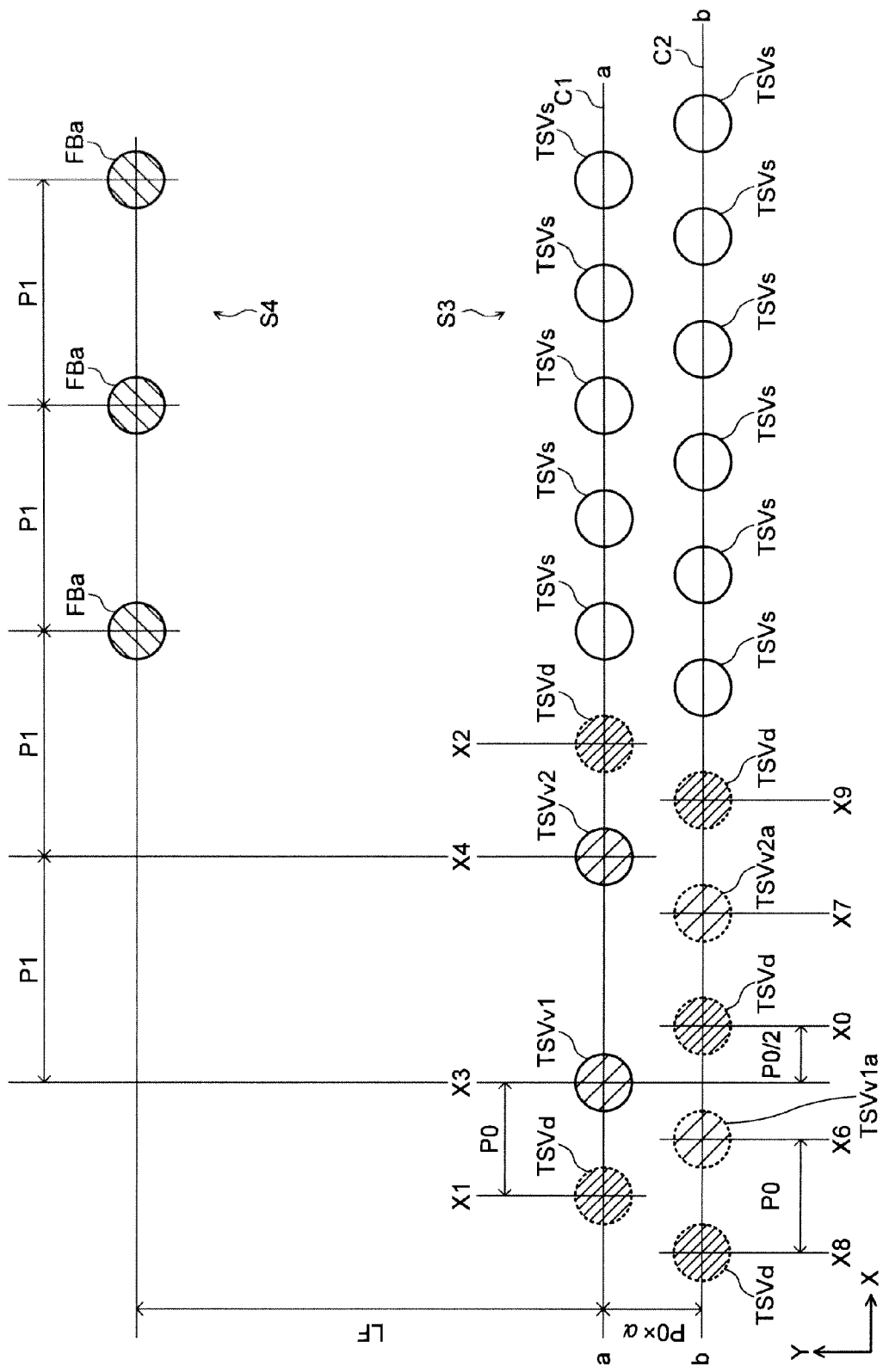
FIG. 12 is a layout chart of the penetrating electrodes TSV and top-surface bumps FB disposed in the region A shown in FIG. 7 according to a second embodiment of the present invention.

Turning to FIG. 12, according to the second embodiment, the dummy penetrating electrode TSVd at coordinate X5 between the power-supply penetrating electrodes TSVv1 and TSVv2 is removed. The configuration of the other components is the same as the layout shown in FIG. 8. According to the configuration, even if displacement of the substrate electrodes 91 occurs on the interposer IP, the power supply is not short-circuited.

The following describes a third embodiment of the present invention.

Figure 13:
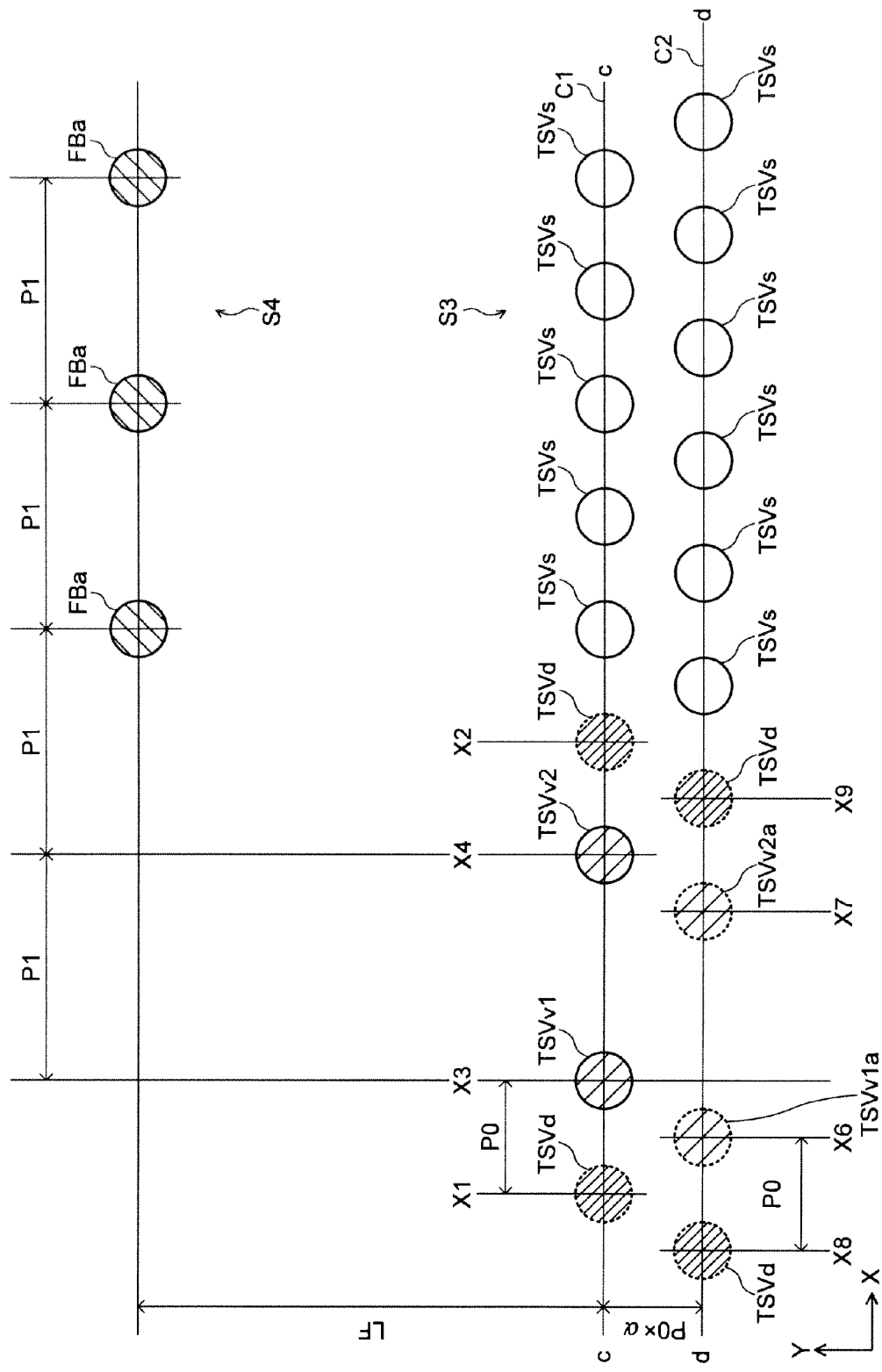
FIG. 13 is a layout chart of the penetrating electrodes TSV and top-surface bumps FB disposed in the region A shown in FIG. 7 according to a third embodiment of the present invention.
Figure 14:
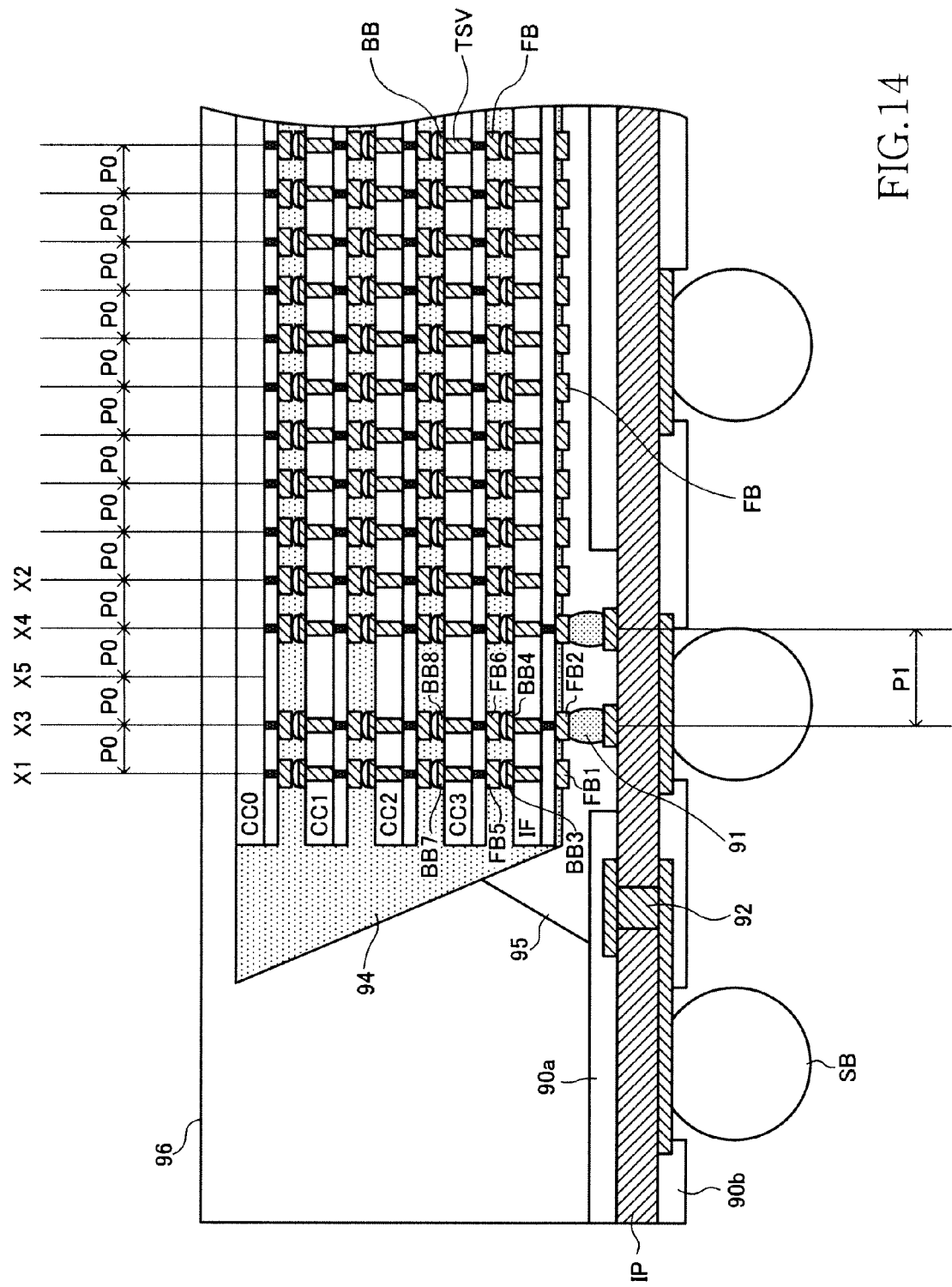
FIG. 14 is a cross-sectional view of FIG. 13 taken along line c-c (line C1) shown in FIG. 13.
Figure 15:
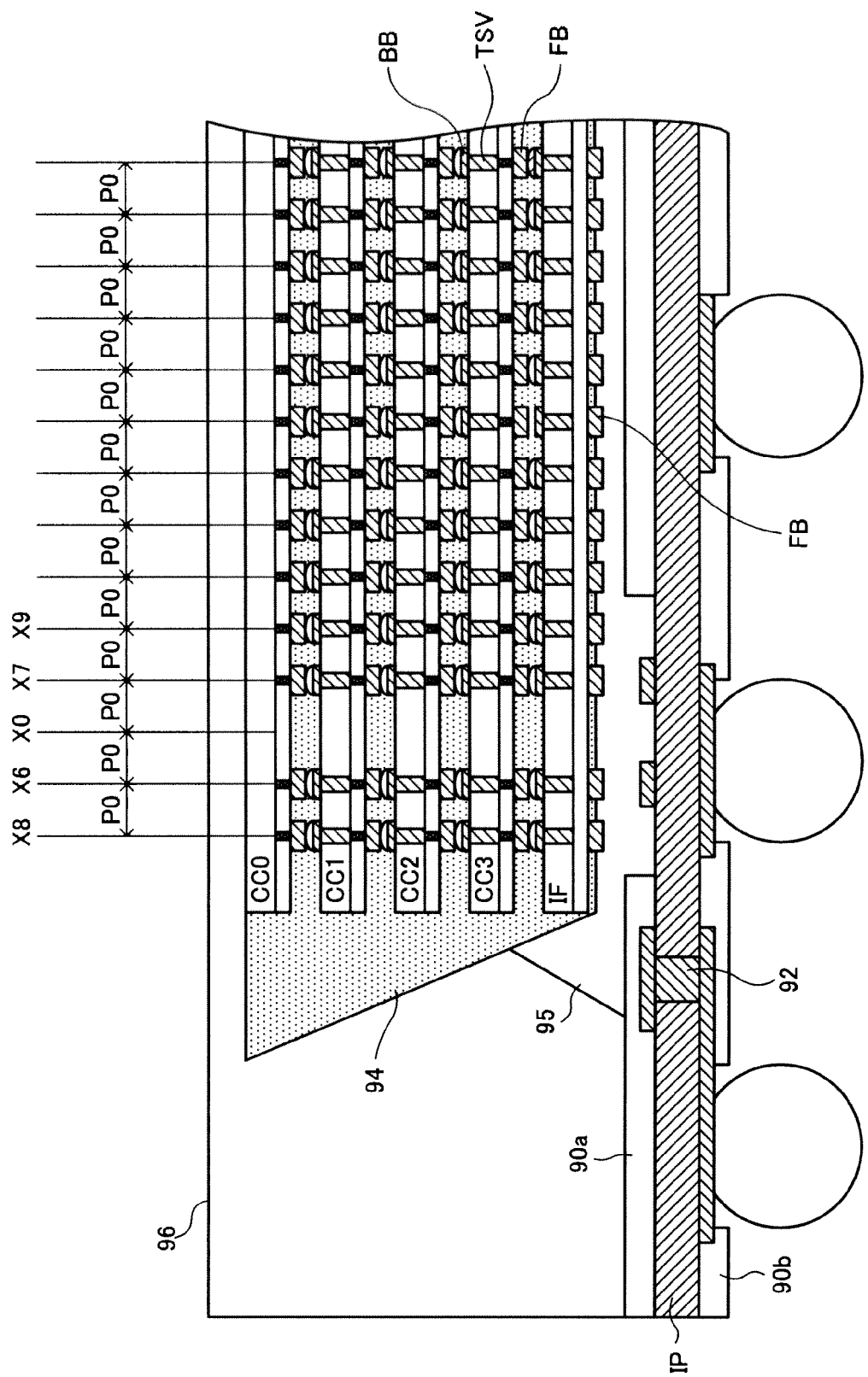
FIG. 15 is a cross-sectional view of FIG. 13 taken along line d-d (line C2) shown in FIG. 13.

Turning to FIG. 13, according to the third embodiment, the dummy penetrating electrode TSVd at coordinate X0 between the power supply-assistance penetrating electrodes TSVv1a and TSVv2a, as well as the dummy penetrating electrode TSVd at coordinate X5 between the power-supply penetrating electrodes TVv1 and TSVv2, is removed. The configuration of the other components is the same as the layout shown in FIG. 8. As shown in FIGS. 14 and 15, which are cross-sectional views, even on the core chips CC1 to CC3, the penetrating electrodes TSV at coordinates X5 and X0 are removed. According to the present invention, the top-surface bump FB1 to back-surface bump BB8 shown in FIG. 14 may be referred to as "first bump" to "eighth bump", respectively.

As described above with reference to FIG. 11, the power supply is short-circuited basically when the distance between the substrate electrodes 91v1 and 91v2 is narrower than the diameter of the dummy penetrating electrode TSVd. However, the power supply can be short-circuited even when the distance is wider than the diameter of the dummy penetrating electrode TSVd. One of the possible reasons is that, as shown in FIG. 11, as the penetrating electrode TSVv1 is pressed against an area that is closer to the left side than to the center of the substrate electrode 91v1, and as the penetrating electrode TSVv2 is pressed against an area that is closer to the right side than to the center of the substrate electrode 91v2, the substrate electrodes 91v1 and 91v2 are deformed, thereby narrowing the distance between the substrate electrodes 91v1 and 91v2. In such a case, under some conditions, the penetrating electrodes TSVv1 and TSVv2 can be short-circuited via the power supply-assistance penetrating electrode TSVv2a shown in FIG. 12 and the dummy penetrating electrode TSVd adjacent to the penetrating electrode TSVv2a. However, according to the present embodiment, such a possibility is eliminated. Therefore, it is possible to increase the reliability of the product.

The following describes a fourth embodiment of the present invention.

Figure 16:
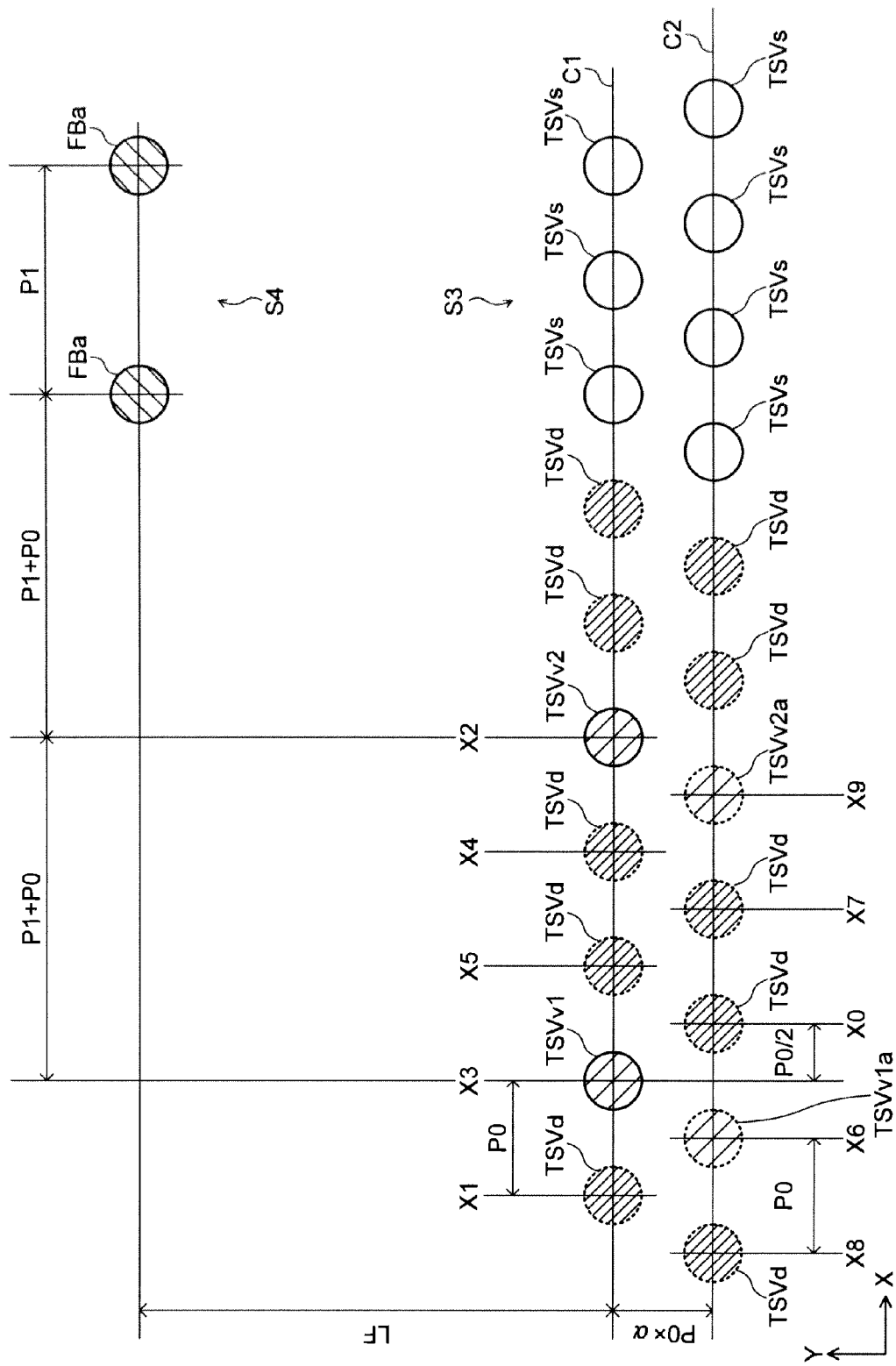
FIG. 16 is a layout chart of the penetrating electrodes TSV and top-surface bumps FB disposed in the region A shown in FIG. 7 according to a fourth embodiment of the present invention.

Turning to FIG. 16, according to the present embodiment, the distance between the power-supply penetrating electrodes TSVv1 and TSVv2 is designed in advance so as to be wider than pitch P1. More specifically, while the distance between the power-supply penetrating electrodes TSVv1 and TSVv2 is pitch P1 according to the first to third embodiments, the distance is increased to P1+P0 according to the present embodiment. Therefore, between the power-supply penetrating electrodes TSVv1 and TSVv2, two dummy penetrating electrodes TSVd can be placed. Therefore, even if the substrate electrodes 91 are displaced or deformed, the power supply is not short-circuited. Moreover, there is no need to remove some of the dummy penetrating electrodes TSVd. Therefore, the formation density of the penetrating electrodes TSV can be increased to the same level as in the first embodiment.

It is apparent that the present invention is not limited to the above embodiments, but may be modified and changed without departing from the scope and spirit of the invention.

For example, according to each of the above-described embodiments, there has been described a semiconductor device of a type in which the interface chip IF and the core chips CC0 to CC3 are stacked. However, the present invention is not limited to the above type. Accordingly, the type and number of semiconductor chips stacked are not specifically limited. Moreover, the technical concept of the present invention is realized not only in the situation where a plurality of semiconductor chips are stacked, but also in a single semiconductor chip that has not yet been stacked. The reason is that even a semiconductor chip that has not yet been stacked can achieve the above-described advantageous effects in the subsequent stacking process. Therefore, the scope of the present invention is not limited to the stacked semiconductor device.

According to each of the above-described embodiments, the dummy penetrating electrodes TSVd are provided adjacent to the power-supply penetrating electrodes TSVv1 and TSVv2. The dummy penetrating electrodes TSVd may also be provided adjacent to the signal penetrating electrodes TSVs.

According to each of the above-described embodiments, the power supply-assistance penetrating electrodes TSVv1a and TSVv2a are provided adjacent to the power-supply penetrating electrodes TSVv1 and TSVv2. However, according the present invention, no power supply-assistance penetrating electrodes may be provided. For example, instead of the power supply-assistance penetrating electrodes TSVv1a and TSVv2a of the first to fourth embodiments, dummy penetrating electrodes TSVd may be provided.

Figure 17:
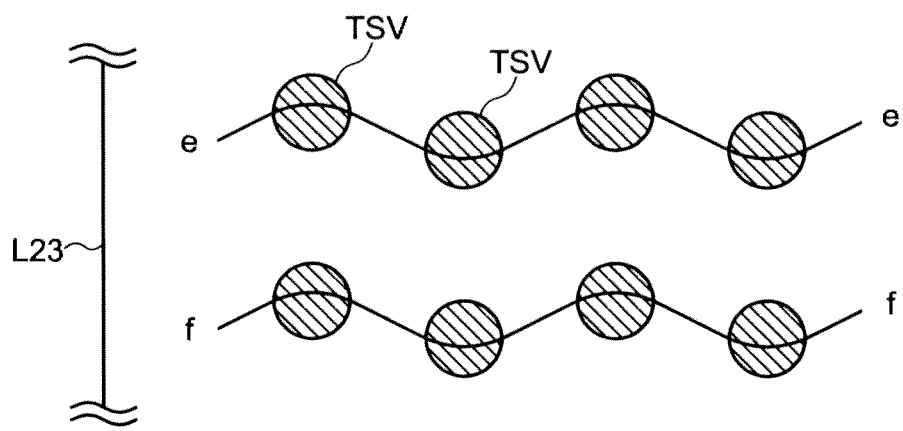
FIG. 17 is a layout chart indicative of an embodiment of the penetrating electrodes TSV that are arranged along curved lines.

Furthermore, according to each of the above-described embodiments, among the penetrating electrodes TSV arranged on lines a-a to d-d, the penetrating electrodes TSV closest to the sides of the chips work as dummy penetrating electrodes TSVd. However, instead of the dummy penetrating electrodes TSVd, the power supply-assistance penetrating electrodes TSVv1a and TSVv2a may be disposed. Incidentally, lines a-a to d-d shown in each of the above-described embodiments are not necessarily perfect straight lines. The lines may be curved as in line e-e or f-f shown in FIG. 17.

What is claimed is:

1. A semiconductor device comprising:
   a first semiconductor chip including a first internal circuit formed in a first semiconductor substrate; and
   a first plurality of penetrating electrodes each penetrating through the first semiconductor substrate, wherein
   the first plurality of penetrating electrodes includes a second plurality of penetrating electrodes arranged collinearly along a first line, the first line being a straight line,
   the second plurality of penetrating electrodes includes a first penetrating electrode, a second penetrating electrode, a third penetrating electrode and a fourth penetrating electrode,
   the first penetrating electrode and the second penetrating electrode are in a floating state without being electrically connected to the first internal circuit,
   the third penetrating electrode is electrically connected to a first power supply line that conveys a first power supply potential to the first internal circuit,
   the fourth penetrating electrode is electrically connected to a second power supply line that conveys a second power supply potential to the first internal circuit,
   the third penetrating electrode and the fourth penetrating electrode are arranged between the first penetrating electrode and the second penetrating electrode, and
   wherein the second plurality of penetrating electrodes further includes a fifth penetrating electrode arranged between the third penetrating electrode and the fourth penetrating electrode, the fifth penetrating electrode being in the floating state without being electrically connected to the first internal circuit, the second power supply potential being different from the first power supply potential.

2. The semiconductor device as claimed in claim 1, wherein the first penetrating electrode is arranged closest to a first side of the first semiconductor chip, among the second plurality of penetrating electrodes arranged along the first line.

3. The semiconductor device as claimed in claim 1, wherein
   the first penetrating electrode and the third penetrating electrode are arranged adjacent to each other,
   the second penetrating electrode and the fourth penetrating electrode are arranged adjacent to each other,
   a first distance between the third penetrating electrode and the fourth penetrating electrode is wider than a second distance between the first penetrating electrode and the third penetrating electrode, and
   the first distance is wider than a third distance between the second penetrating electrode and the fourth penetrating electrode.

4. The semiconductor device as claimed in claim 1, wherein
   the first plurality of penetrating electrodes further includes a third plurality of penetrating electrodes arranged along a second line that is parallel to the first line,
   the third plurality of penetrating electrodes includes a sixth penetrating electrode and a seventh penetrating electrode,
   the sixth penetrating electrode is electrically connected to the first power supply line,
   the seventh penetrating electrode is electrically connected to the second power supply line,
   the third penetrating electrode and the sixth penetrating electrode are arranged adjacent to each other, and
   the fourth penetrating electrode and the seventh penetrating electrode are arranged adjacent to each other.

5. The semiconductor device as claimed in claim 4, wherein
   the third plurality of penetrating electrodes further includes an eighth penetrating electrode and a ninth penetrating electrode arranged along the second line,
   the sixth penetrating electrode and the seventh penetrating electrode are arranged between the eighth penetrating electrode and the ninth penetrating electrode, and
   the eighth penetrating electrode is arranged closest to the first side of the first semiconductor chip, among the third plurality of penetrating electrodes arranged along the second line.

6. The semiconductor device as claimed in claim 4, wherein no penetrating electrode is disposed between the sixth penetrating electrode and the seventh penetrating electrode such that the sixth penetrating electrode and the seventh penetrating electrode are adjacent to each other.

7. The semiconductor device as claimed in claim 1, further comprising:
   a second semiconductor chip stacked over the first semiconductor chip, the second semiconductor chip including a second internal circuit formed in a second semiconductor substrate and a fourth plurality of penetrating electrodes each penetrating through the second semiconductor substrate, wherein
   the fourth plurality of penetrating electrodes of the second semiconductor chip includes a tenth penetrating electrode, an eleventh penetrating electrode, a twelfth penetrating electrode, and a thirteenth penetrating electrode that are vertically aligned with the first penetrating electrode, the second penetrating electrode, the third penetrating electrode, and the fourth penetrating electrode, respectively,
   the tenth penetrating electrode and the eleventh penetrating electrode are in the floating state without being electrically connected to the second internal circuit,
   the twelfth penetrating electrode is electrically connected to a third power supply line that conveys the first power supply potential to the second internal circuit of the second semiconductor chip,
   the thirteenth penetrating electrode is electrically connected to a fourth power supply line that conveys the second power supply potential to the second internal circuit of the second semiconductor chip, and
   the twelfth penetrating electrode and the thirteenth penetrating electrode are electrically connected to the third penetrating electrode and the fourth penetrating electrode, respectively.

8. The semiconductor device as claimed in claim 7, wherein the tenth penetrating electrode and the eleventh penetrating electrode are not electrically connected to the first penetrating electrode and the second penetrating electrode, respectively.

* * * * *